United States Patent
Yasutake

(10) Patent No.: US 8,405,061 B2
(45) Date of Patent: Mar. 26, 2013

(54) SEMICONDUCTOR MEMORY DEVICE USING VARIABLE RESISTANCE ELEMENT OR PHASE-CHANGE ELEMENT AS MEMORY DEVICE

(75) Inventor: Nobuaki Yasutake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 94 days.

(21) Appl. No.: 12/871,289

(22) Filed: Aug. 30, 2010

(65) Prior Publication Data

US 2011/0147691 A1   Jun. 23, 2011

(30) Foreign Application Priority Data

Dec. 17, 2009   (JP) .................... 2009-286674

(51) Int. Cl.
*H01L 29/06* (2006.01)
(52) U.S. Cl. .......... 257/3; 257/5; 257/E45.002
(58) Field of Classification Search ........... 257/3, 5, 257/E45.002
See application file for complete search history.

(56) References Cited

U.S. PATENT DOCUMENTS

2007/0132049 A1 * 6/2007 Stipe .................. 257/421
2008/0111120 A1 * 5/2008 Lee et al. .............. 257/2

FOREIGN PATENT DOCUMENTS

| JP | 2008-198979 | 8/2008 |
| JP | 2009-123900 | 6/2009 |

OTHER PUBLICATIONS

U.S. Appl. No. 12/618,122, filed Nov. 13, 2009, Masanori Komura, et al.
U.S. Appl. No. 13/431,150, filed Mar. 27, 2012, Nishimura.

* cited by examiner

*Primary Examiner* — Minh-Loan T Tran
(74) *Attorney, Agent, or Firm* — Oblon, Spivak, McClelland, Maier & Neustadt, L.L.P.

(57) ABSTRACT

A semiconductor memory device includes a first conductive line, a second conductive line, a cell unit, a silicon nitride film and a double-sidewall film. The first conductive line extends in a first direction. The second conductive line extends in a second direction crossing the first direction. The cell unit includes a phase-change film and a rectifier element connected in series with each other between the first conductive line and the second conductive line. The silicon nitride film is formed on a side surface of the phase-change film. The double-sidewall film includes a silicon oxide film and the silicon nitride film formed on a side surface of the rectifier element.

10 Claims, 25 Drawing Sheets

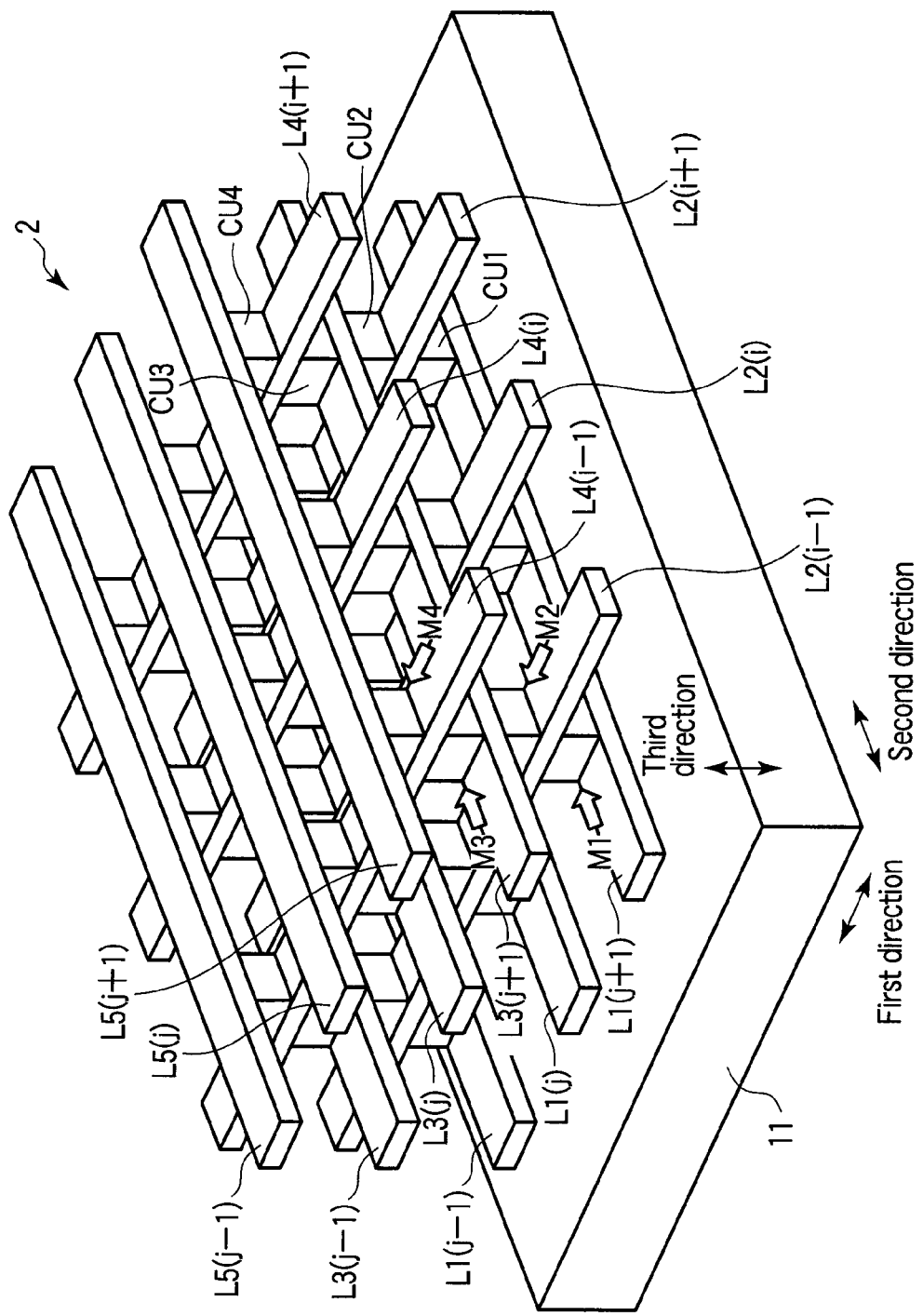
F I G. 2

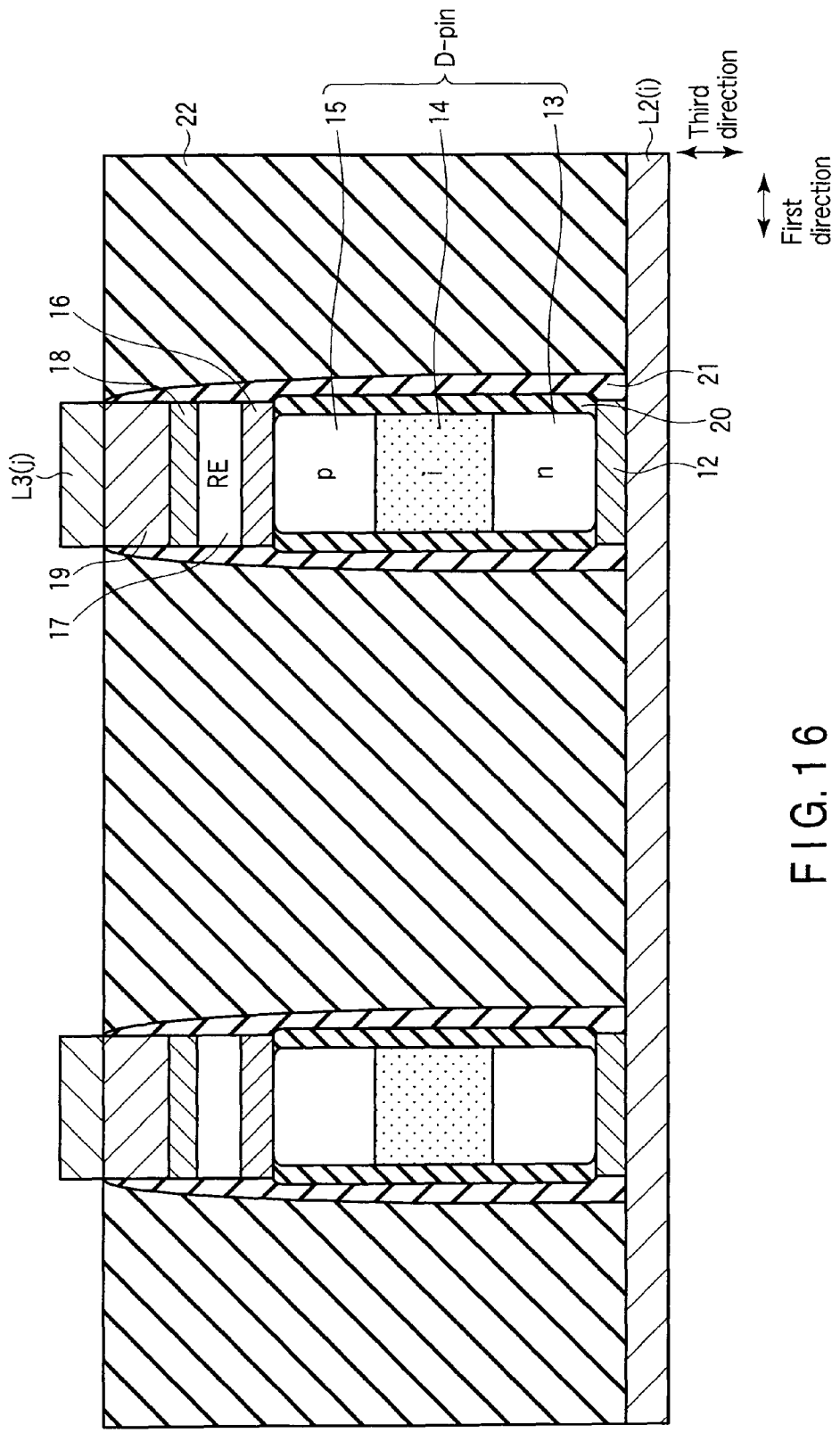
F I G. 16

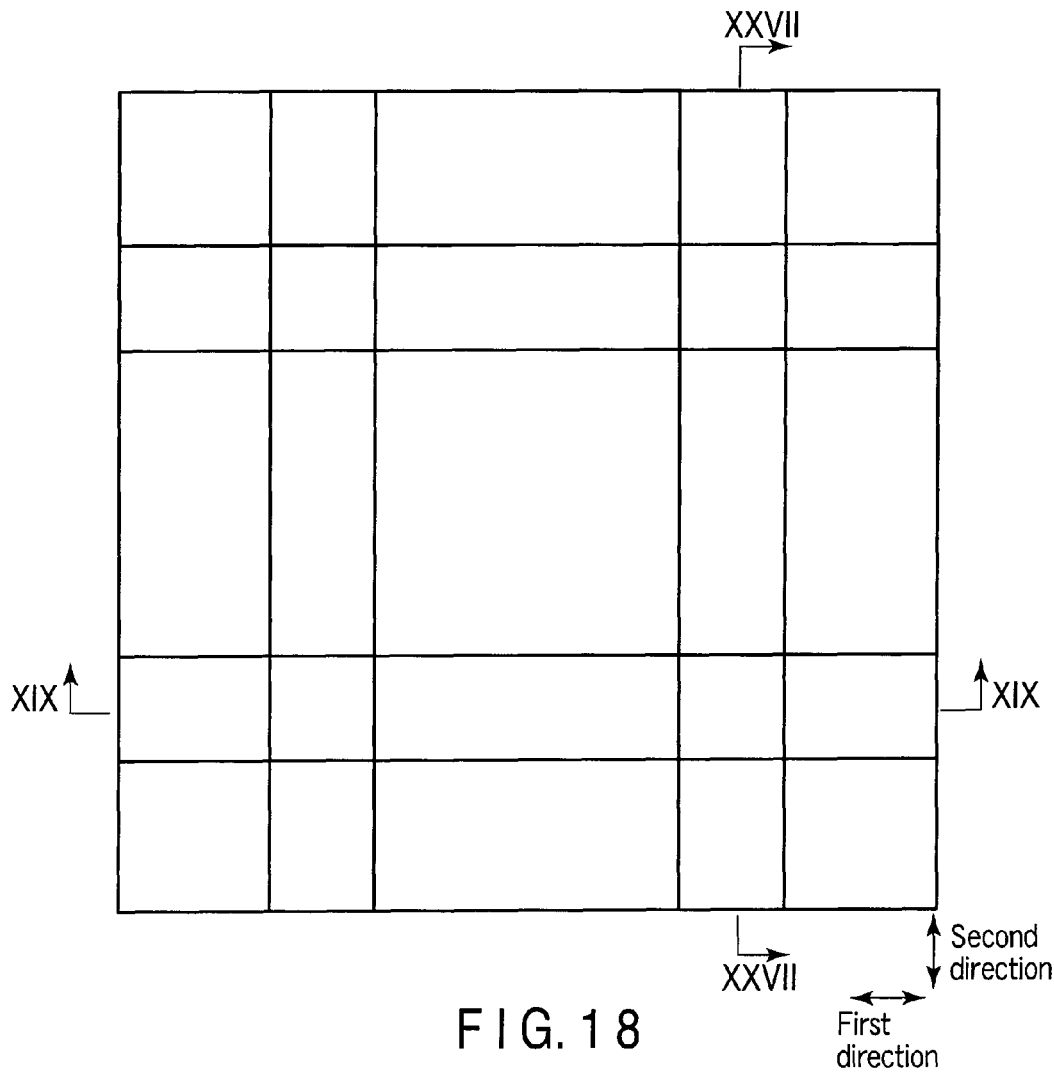
F I G. 18
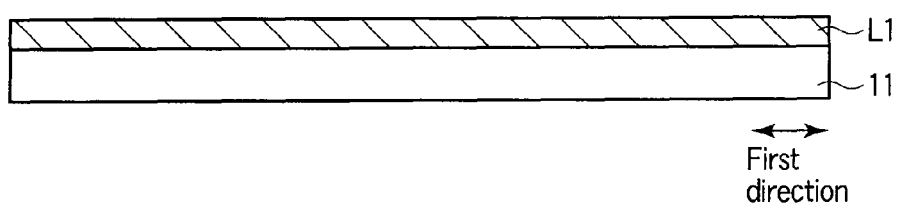
F I G. 19

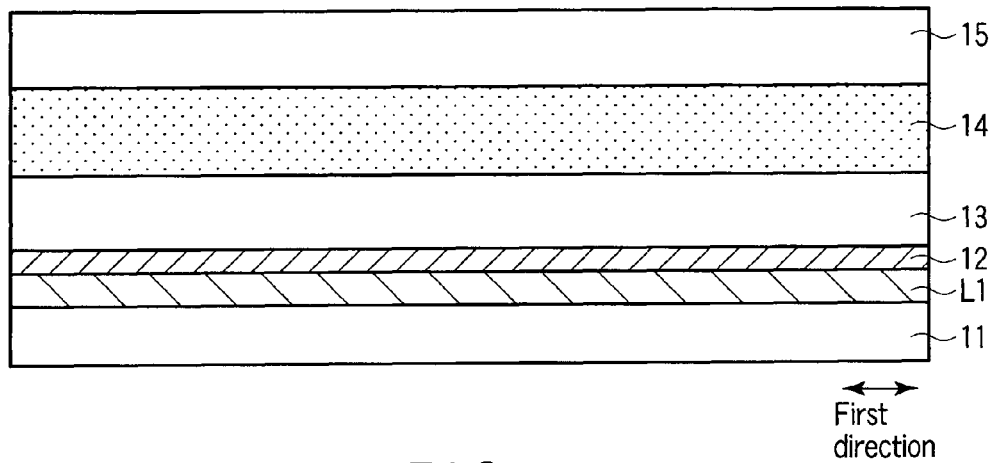
F I G. 20
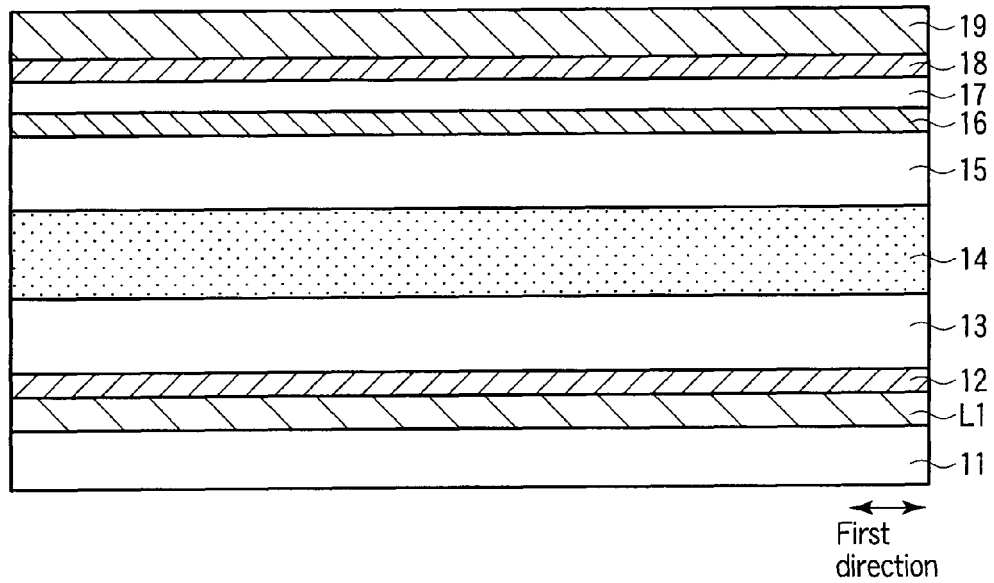
F I G. 21

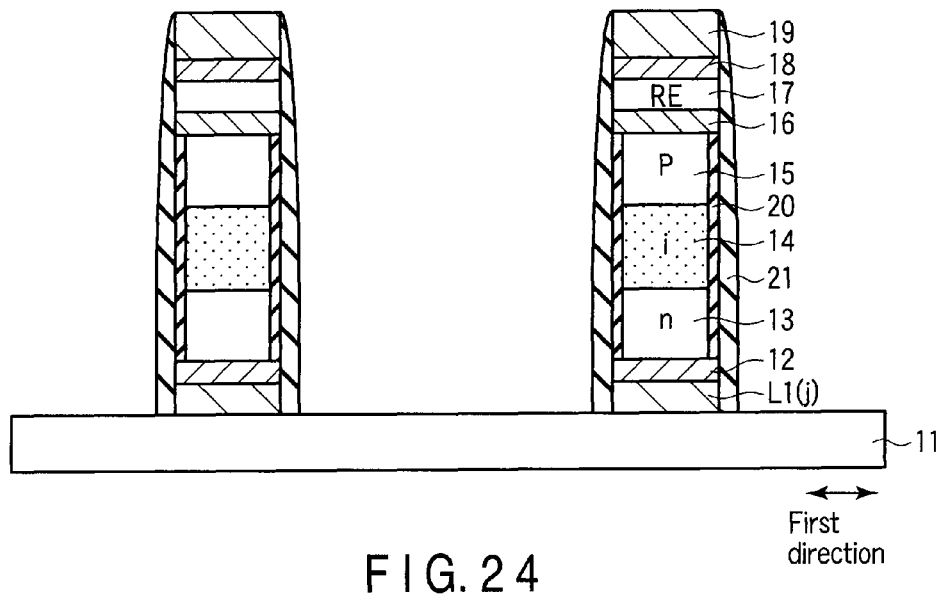
F I G. 24
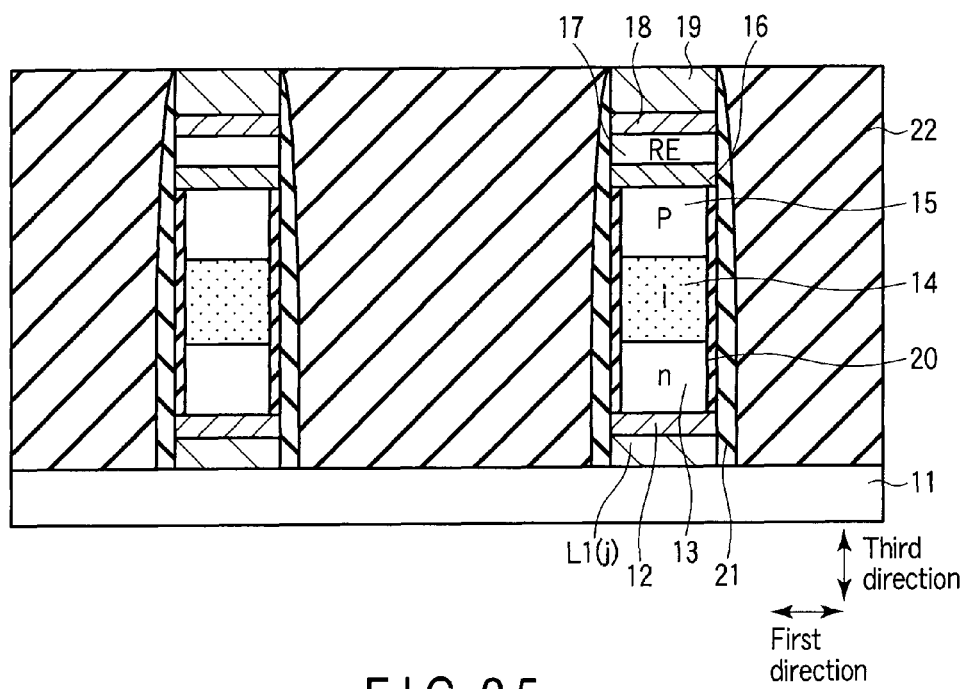
F I G. 25

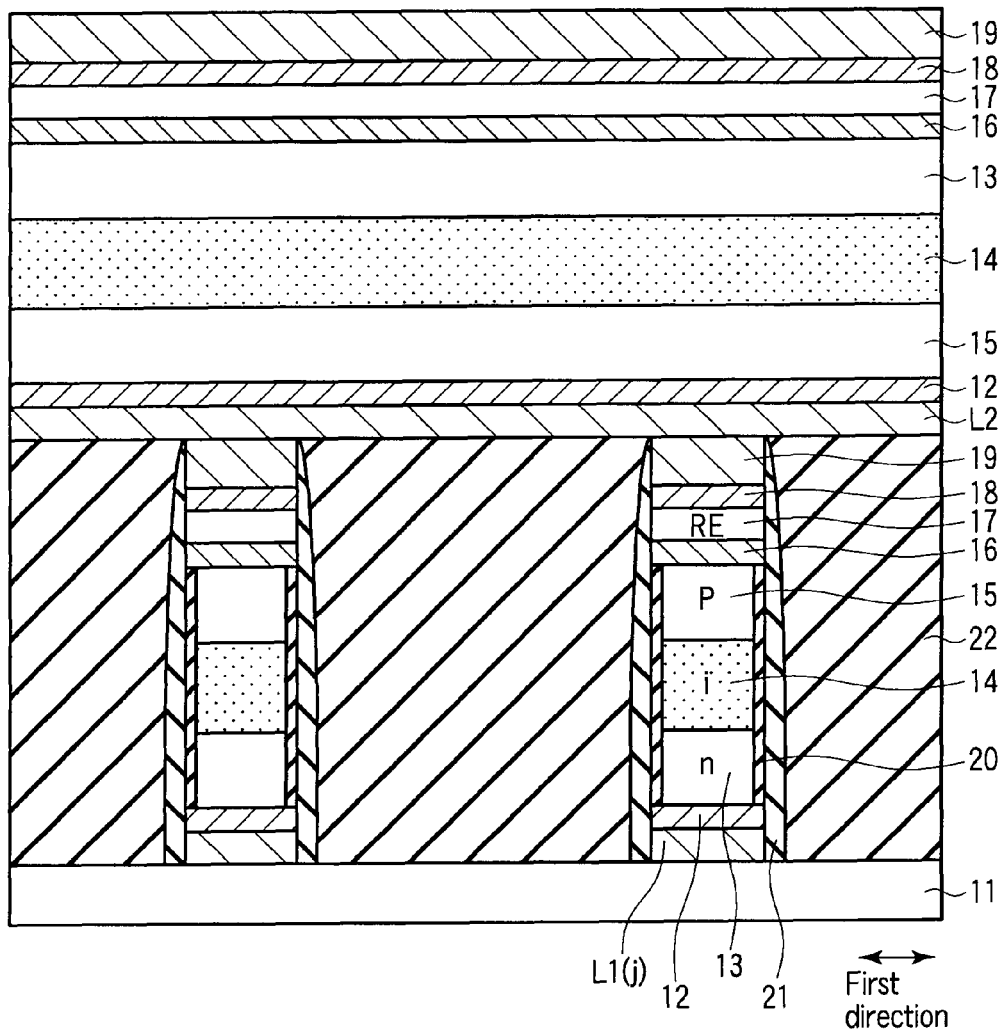
F I G. 26

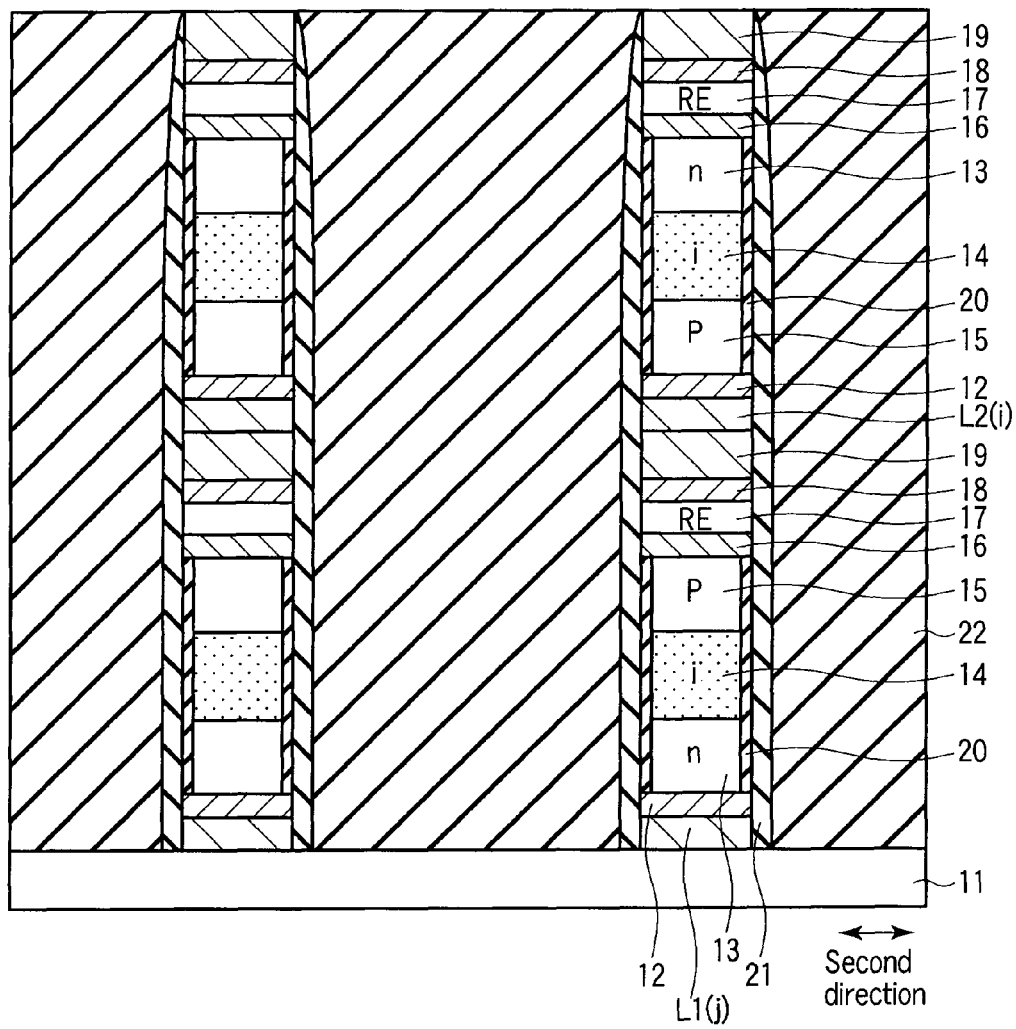
F I G. 3 1

SEMICONDUCTOR MEMORY DEVICE USING VARIABLE RESISTANCE ELEMENT OR PHASE-CHANGE ELEMENT AS MEMORY DEVICE

CROSS-REFERENCE TO RELATED APPLICATIONS

This application is based upon and claims the benefit of priority from prior Japanese Patent Application No. 2009-286674, filed Dec. 17, 2009, the entire contents of which are incorporated herein by reference.

BACKGROUND OF THE INVENTION

1. Field of the Invention

The present invention relates to a semiconductor memory device using a variable resistance element or a phase-change element as a memory element. For example, the present invention relates to a resistance-change memory.

2. Description of the Related Art

In recent years, as an electrically rewritable nonvolatile semiconductor memory device, a resistive RAM (ReRAM) using a variable resistance element as a memory element or a resistance-change memory such as a phase-change RAM (PCRAM) using a phase-change element as a memory element has attracted attention as a succession memory of a flash memory.

In the resistance-change memory, for example, a variable resistance element and a rectifier element such as a diode are stacked on each of cross points of bit lines and word lines to make it possible to configure cell arrays. For this reason, a three-dimensional stacked memory in which a memory capacity can be increased can be formed without increasing a cell array portion in area.

The resistance-change memory finally has a structure in which oxide films are buried in areas between a large number of pillars obtained by stacking variable resistance elements and diodes. The variable resistance element is configured by a variable resistance material/electrode such as an electrode/metal oxide (two- or three-dimensional system).

However, in the structure described above, impurities such as fluorine and hydrogen to be diffused from the inside of an oxide film serving as the buried material into the variable resistance material. It may degrade the characteristics of the variable resistance material. For this reason, a structure in which a side surface of the variable resistance material is covered with a silicon nitride film to suppress the impurities such as fluorine and hydrogen from being diffused is proposed (for example, see Jpn. Pat. Appln. KOKAI Publication No. 2009-123900).

However, when such a silicon nitride film is formed on the side surface of a silicon diode serving as a rectifier element, reverse current increases and degrades the characteristics of the rectifier element.

BRIEF SUMMARY OF THE INVENTION

According to a first aspect of the present invention, there is provided a semiconductor memory device comprising: a first conductive line extending in a first direction; a second conductive line extending in a second direction crossing the first direction; a cell unit including a phase-change film and a rectifier element connected in series with each other between the first conductive line and the second conductive line; a silicon nitride film formed on a side surface of the phase-change film; and a double-sidewall film including a silicon oxide film and the silicon nitride film sequentially formed on a side surface of the rectifier element.

According to a second aspect of the present invention, there is provided a method of manufacturing a semiconductor memory device, comprising: forming a first conductive line on a substrate; stacking a rectifier element and a phase-change film on the first conductive line; forming a silicon oxide film on a side surface of the rectifier element by a thermal oxidation method; and forming a silicon nitride film on a side surface of the phase-change film and on the silicon oxide film on the side surface of the rectifier element.

According to a third aspect of the present invention, there is provided a method of manufacturing a semiconductor memory device, comprising: forming a first conductive layer on a substrate; forming a film to serve as a diode including a semiconductor layer of a first conductivity type and a semiconductor layer of a second conductivity type on the first conductive layer; forming a phase-change film on the film to serve as the diode; etching the first conductive layer, the film to serve as the diode, and the phase-change film into a line pattern; forming a silicon oxide film on a side surface of the film to serve as the diode of the line pattern by a thermal oxidation method; and forming a silicon nitride film on a side surface of the phase-change film and on the silicon oxide film on the side surface of the film to serve as the diode.

BRIEF DESCRIPTION OF THE SEVERAL VIEWS OF THE DRAWING

FIG. 2 is a perspective view of a cross-point memory cell array according to the embodiment;

FIG. 16 is a sectional diagram of a third modification of the cell unit in the embodiment;

FIG. 18 is an upper diagram of the cell unit in the embodiment; and

FIGS. 19 to 31 are a sectional diagram illustrating a method of manufacturing the cell unit according to the embodiment.

DETAILED DESCRIPTION OF THE INVENTION

Figure 1:
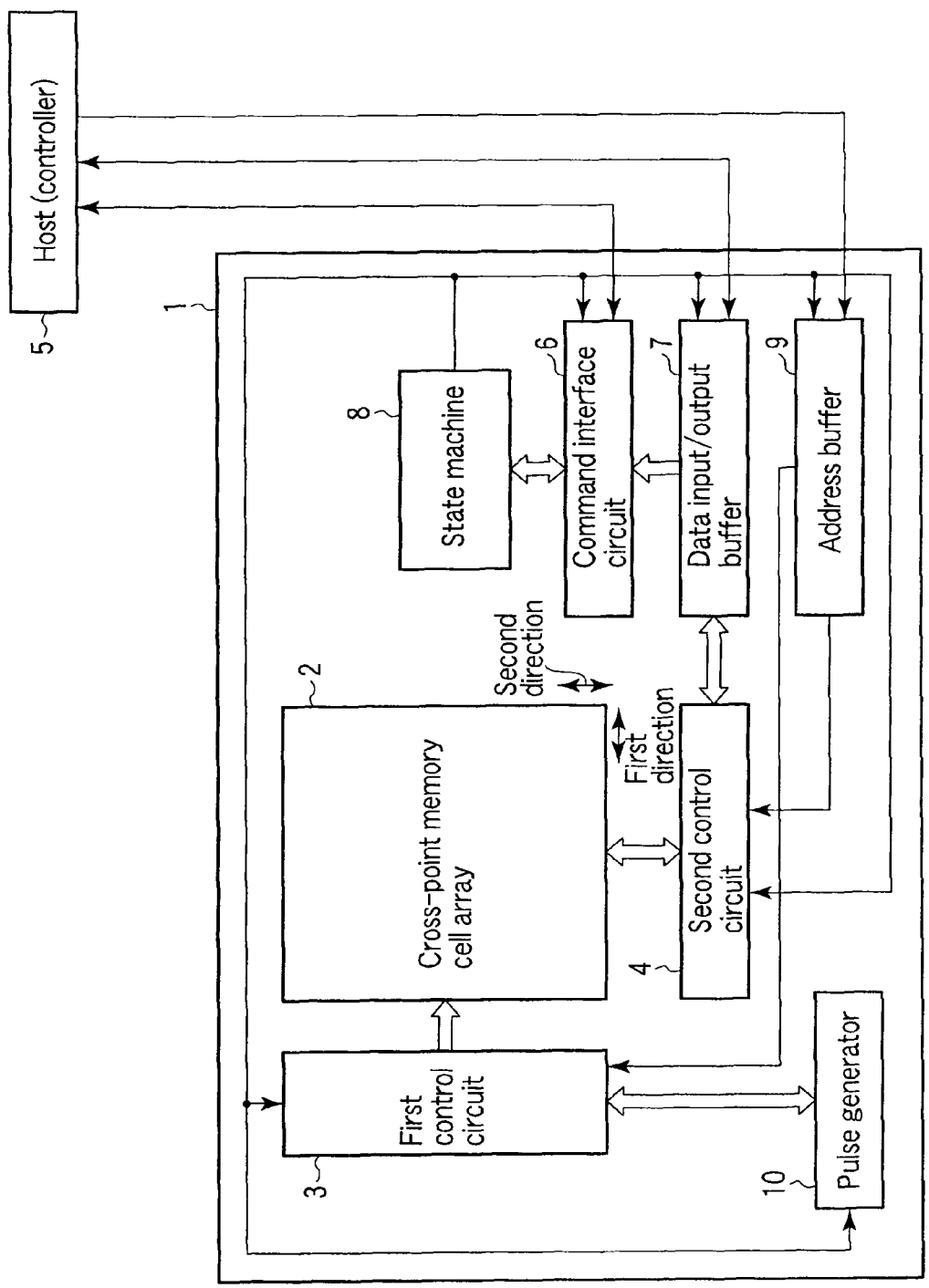
FIG. 1 is a block diagram illustrating a main part of a resistance-change memory according to an embodiment.

A semiconductor memory device according to an embodiment of the present invention and a method of manufacturing the semiconductor memory device will be described below with reference to the accompanying drawings. As a semiconductor memory device, a resistance-change memory is exemplified here. The present invention is not limited to the embodiment (described below) and embodied as various different forms.

[1] BASIC CONFIGURATION

The present invention targets a semiconductor memory device including a resistance-change memory using a variable resistance element or a phase-change element as a memory element. In this case, the variable resistance element is an element mainly consisting of a material the resistance of which changes depending on a voltage, a current, heat, or the like. The phase-change element is an element mainly consisting of a material a physical property such as resistance or capacitance of which changes depending on a phase change.

The phase change (phase transition) includes the following:

Metal-semiconductor transition, metal-insulator transition, metal-metal transition, insulator-insulator transition, insulator-semiconductor transition, insulator-metal transition, semiconductor-semiconductor transition, semiconductor-metal transition, semiconductor-insulator transition Phase change of quantum state (metal-superconductive transition or the like)

Paramagnetic-ferromagnetic transition, anti ferromagnetic-ferromagnetic transition, ferromagnetic-ferromagnetic transition, ferrimagnetic-ferromagnetic transition, and transition of a combination of the above transitions Paraelectric-ferroelectric transition, paraelectric-pyroelectric transition, paraelectric-piezoelectric transition, ferroelectric-ferroelectric transition, antiferroelectric-ferroelectric transition, and transition of a combination of the above transitions Transition of combination of the above transitions For example, a transition from a metal, an insulator, a semiconductor, a ferroelectric material, a paraelectric material, a pyroelectric material, a piezoelectric material, a ferromagnetic material, a ferrimagnetic material, a helimagnetic material, a paramagnetic material, or an antiferromagnetic material to a ferroelectric/ferromagnetic material, and a reverse transition thereof.

According to this definition, a variable resistance element consequently includes a phase-change element. In this specification, the variable resistance element means an element mainly configured by a metal oxide film, a metal compound, an organic thin film, carbon, carbon nanotube, and the like.

The present invention targets a ReRAM or a resistance-change memory such as a PCRAM using a phase-change element as a memory element. This is because these resistance-change memories use cross-point memory cell arrays, can realize large memory capacitances by three-dimensional integration, and can be operated at a high speed almost equal to that of a DRAM.

In the cross-point memory cell array, in order to cause a current to flow in only a memory element, the memory element and a rectifier element are connected in series with each other between a word line and a bit line.

In this case, as a method of changing the resistance of the memory element, a method of changing the polarity of a voltage applied to the memory element to reversibly change the resistance of the memory element between at least a first value and a second value and a method of controlling a magnitude of a voltage and an application time thereof without changing the polarity of the voltage applied to the memory element to reversibly change the resistance of the memory element between at least the first value and the second value are given.

The former is called a bipolar operation, and the latter is called a unipolar operation.

The bipolar operation is employed in, for example, a memory such as a magnetic random access memory which requires bidirectional currents in a write operation. The resistance-change memory according to the present invention can also be bipolar-operated.

The resistance-change memory according to the embodiment of the present invention will be described by using a unipolar operation which controls the magnitude of the voltage and the application time without changing the polarity of the voltage applied to the memory element to reversibly change the resistance of the memory element between at the first value and the second value.

When the resistance-change memory (to be referred to as a cross-point resistance-change memory hereinafter) having a cross-point memory cell array is to be unipolar-operation, the rectifier element requires a large current when forward biased, a small current when reverse biased, and a large breakdown voltage to accurately perform set/reset and read operations.

In the resistance-change memory, a structure in which at each of cross-points between bit lines and word lines, a cell unit configured by a memory element and a rectifier element is arranged, and an insulating interlayer such as an oxide film is buried in an area between a plurality of cell units.

In this structure, an impurity such as fluorine, or hydrogen is diffused from the oxide film buried in an area between the cell units into the memory element, and the characteristics of the memory element may be degraded.

Therefore, in the embodiment of the present invention, the silicon nitride film is formed on the side surface of the memory element to prevent the impurity such as fluorine or hydrogen from being diffused into the memory element.

However, when such a silicon nitride film is formed on the side surface of a diode serving as a rectifier element, reverse current in the rectifier element increases and degrades the characteristics of the rectifier element.

For this reason, furthermore, in the embodiment of the present invention, the silicon oxide film is formed on the side surface of the rectifier element to suppress increase of the reverse current in the rectifier element.

In this manner, a resistance-change memory which can maximally exert the capability of a cell unit configured by a memory element and a rectifier element is provided.

[2] EMBODIMENT

[2-1] Overall View

FIG. 1 is a block diagram illustrating a main part of a resistance-change memory according to the embodiment.

A resistance-change memory (for example, chip) 1 has a cross-point memory cell array 2. The cross-point memory cell array 2 is configured by a stacked structure of a plurality of memory cell arrays.

A first control circuit 3 is arranged at one end of the cross-point memory cell array 2 in a first direction, and a second control circuit 4 is arranged at an end of the cross-point memory cell array 2 in a second direction crossing the first direction.

The first and second control circuits 3 and 4 select one of the plurality of stacked memory cell arrays on the basis of, for example, a memory cell array selection signal.

The first control circuit 3 selects a row of the cross-point memory cell array 2 on the basis of, for example, a row address signal. The second control circuit 4 selects a column of the cross-point memory cell array 2 on the basis of, for example, a column address signal.

The first and second control circuits 3 and 4 control writing/erasing/reading of a memory element in the cross-point memory cell array 2.

The first control circuits 3 and 4 can also write/erase/read one of the plurality of stacked memory cell arrays and can also simultaneously write/erase/read two or more or all of the plurality of stacked memory cell arrays.

In this case, in the resistance-change memory 1, for example, writing is called setting, and erasing is called resetting. The resistance in the set state is merely required to be different from that in the reset state. It does not matter whether the resistance in the set state is higher or lower than that in the reset state.

In the set operation, when one of a plurality of resistances is designed to be selectively written, a multi-level resistance-change memory in which one memory element stores multi-level data can also be realized.

A controller 5 supplies a control signal to write data to the resistance-change memory 1. The control signal is input to a command interface circuit 6, and the data is input to a data input/output buffer 7. The controller 5 may be arranged in the chip 1 or may be arranged in a host (computer) different from the resistance-change memory 1.

The command interface circuit 6 determines, on the basis of the control signal, whether the data from the host 5 is command data or not. When the data is command data, the command interface circuit 6 transfers the command data from the data input/output buffer 7 to a state machine 8.

The state machine 8 manages operations on the resistance-change memory 1 on the basis of the command data. For example, the state machine 8 manages a set/reset operation on the basis of the command data from the controller 5.

The controller 5 can also receive status information managed by the state machine 8 to determine an operation result in the resistance-change memory 1.

In the set/reset operation and the read operation, the controller 5 supplies an address signal to the resistance-change memory 1. The address signal includes, for example, a memory cell array selection signal, a row address signal, and a column address signal.

The address signal is input to the first and second control circuits 3 and 4 through an address buffer 9.

A pulse generator 10, on the basis of an instruction from the state machine 8, outputs a voltage pulse or a current pulse required for the set/reset operation and the read operation at a predetermined timing.

[2-2] Memory Cell Array

FIG. 2 is a perspective view of a cross-point memory cell array in the embodiment.

The cross-point memory cell array 2 is arranged on a semiconductor substrate (for example, silicon substrate) 11. A circuit element such as a MOS transistor or an insulating film may be sandwiched between the cross-point memory cell array 2 and the semiconductor substrate 11.

FIG. 2 illustrates, as an example, the case in which the cross-point memory cell array 2 is configured by four memory cell arrays M1 to M4 stacked in a third direction (direction perpendicular to a major plane of the semiconductor substrate 11).

Memory cell array M1 is configured by a plurality of cell units CU1 arranged in the form of an array in the first and second directions.

Similarly, memory cell array M2 is configured by a plurality of cell units CU2, memory cell array M3 is configured by a plurality of cell units CU3 arranged in the form of an array, and memory cell array M4 is configured by a plurality of cell units CU4 arranged in the form of an array.

Each of CU1 to CU4 is configured by a memory element and a rectifier (non-ohmic element) connected in series with each other.

On the semiconductor substrate 11, conductive lines $L1(j-1)$, $L1(j)$, and $L1(j+1)$, conductive lines $L2(i-1)$, $L2(i)$, and $L2(i+1)$, conductive lines $L3(j-1)$, $L3(j)$, and $L3(j+1)$, conductive lines $L4(i-1)$, $L4(i)$, and $L4(i+1)$, and conductive lines $L5(j-1)$, $L5(j)$, and $L5(i+1)$ are sequentially arranged from the semiconductor substrate 11 side.

Odd-numbered conductive lines from the semiconductor substrate 11 side, i.e., conductive lines $L1(j-1)$, $L1(j)$, and $L1(j+1)$, conductive lines $L3(j-1)$, $L3(j)$, and $L3(j+1)$, and conductive lines $L5(j-1)$, $L5(j)$, and $L5(i+1)$ extend in the second direction.

Even-numbered conductive lines from the semiconductor substrate 11 side, i.e., conductive lines $L2(i-1)$, $L2(i)$, and $L2(i+1)$ and conductive lines $L4(i-1)$, $L4(i)$, and $L4(i+1)$ extend in the first direction crossing the second direction.

These conductive lines function as word lines or bit lines.

The lowest first memory cell array M1 is arranged between the first conductive lines $L1(j-1)$, $L1(j)$, and $L1(j+1)$ and the second conductive lines $L2(i-1)$, $L2(i)$, and $L2(i+1)$. In a set/reset operation and a read operation on memory cell array M1, one set of conductive lines $L1(j-1)$, $L1(j)$, and $L1(j+1)$ and conductive lines $L2(i-1)$, $L2(i)$, and $L2(i+1)$ is caused to function as word lines, and the other set is caused to function as bit lines.

Memory cell array M2 is arranged between the second conductive lines $L2(i-1)$, $L2(i)$, and $L2(i+1)$ and the third conductive lines $L3(j-1)$, $L3(j)$, and $L3(j+1)$. In a set/reset operation and a read operation on memory cell array M2, one set of conductive lines $L2(i-1)$, $L2(i)$, and $L2(i+1)$ and conductive lines $L3(j-1)$, $L3(j)$, and $L3(j+1)$ is caused to function as word lines, and the other set is caused to function as bit lines.

Memory cell array M3 is arranged between the third conductive lines $L3(j-1)$, $L3(j)$, and $L3(j+1)$ and the fourth conductive lines $L4(i-1)$, $L4(i)$, and $L4(i+1)$. In a set/reset operation and a read operation on memory cell array M3, one set of conductive lines $L3(j-1)$, $L3(j)$, and $L3(j+1)$ and conductive lines $L4(i-1)$, $L4(i)$, and $L4(i+1)$ is caused to function as word lines, and the other set is caused to function as bit lines.

Memory cell array M4 is arranged between the fourth conductive lines $L4(i-1)$, $L4(i)$, and $L4(i+1)$ and the fifth conductive lines $L5(j-1)$, $L5(j)$, and $L5(i+1)$. In a set/reset operation and a read operation on memory cell array M4, one set of conductive lines $L4(i-1)$, $L4(i)$, and $L4(i+1)$ is caused to function as word lines, and the other set is caused to function as bit lines.

In this case, at crossing points between the lines L1($j$−1), L1($j$), and L1($j$+1) and the lines L2($i$−1), L2($i$), and L2($i$+1), crossing points between the lines L2($i$−1), L2($i$), and L2($i$+1) and the lines L3($j$−1), L3($j$), and L3($j$+1), crossing points between the lines L3($j$−1), L3($j$), and L3($j$+1) and the lines L4($i$−1), L4($i$), and L4($i$+1), and crossing points between the lines L4($i$−1), L4($i$), and L4($i$+1) and the lines L5($j$−1), L5($j$), and L5($j$+1), cell units CU are arranged, respectively. More specifically, the cell units CU are arranged at points where continuously stacked lines cross each other.

[2-3] Cell Unit

Figures 3, 4:
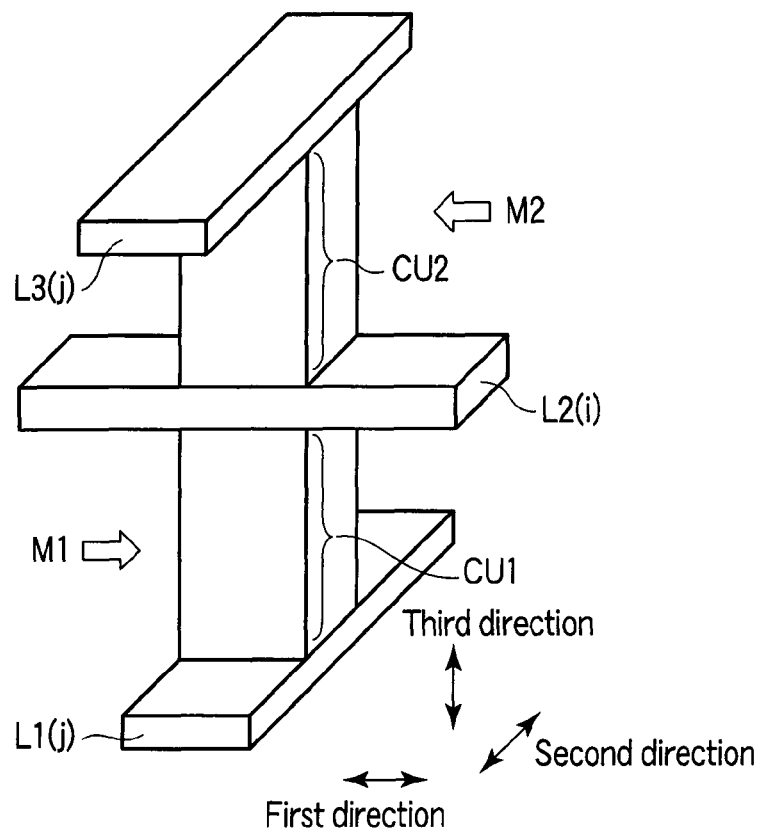
FIG. 3 is a perspective view of cell units in two memory cell arrays according to the embodiment.
FIG. 4 is a diagram illustrating connection relationships between memory elements and rectifier elements in a cell unit according to the embodiment.

FIG. 3 is a perspective view of cell units in two memory cell arrays in the embodiment.

For example, cell units CU1 and CU2 in the two memory cell arrays M1 and M2 in FIG. 2 are shown here. In this case, the configurations of cell units in the two memory cell arrays M3 and M4 in FIG. 2 are the same as those of the cell units in the two memory cell arrays M1 and M2 in FIG. 2.

Each of cell units CU1 and CU2 is configured by a memory element and a rectifier element connected in series with each other.

Connection relationships between the memory elements and the rectifier elements have various patterns.

All cell units in one memory cell array must have the same connection relationship between the memory element and the rectifier element.

Figure 5:
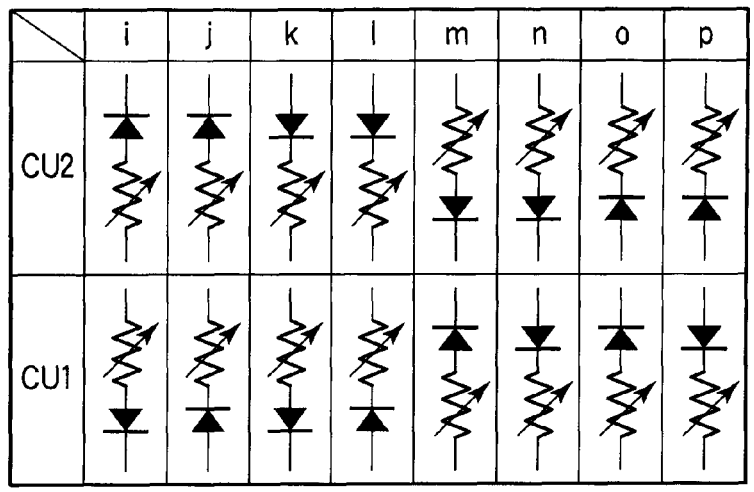
FIG. 5 is a diagram illustrating connection relationships between memory elements and rectifier elements in the cell unit according to the embodiment.

FIGS. 4 and 5 illustrate connection relationships between memory elements and rectifier elements.

In one cell unit, as connection relationships between memory elements and rectifier elements, a total of four relationships including two positional relationships between the memory elements and the rectifier elements and two directions of the rectifier elements. Therefore, with respect to cell units in two memory cell arrays, the connection relationships between the memory elements and the rectifier elements have sixteen (4×4) patterns.

Columns a to p in FIGS. 4 and 5 illustrate the sixteen connection relationships, respectively.

In the drawings, the lower side in cell units CU1 and CU2 indicates a semiconductor substrate side.

The embodiment of the present invention can be applied to all sixteen connection relationships. However, in the following explanation, the connection relationship represented by c is exemplified. This is because, when the directions of the diodes are made symmetrical about the conductive line L as described above, the upper and lower cell units CU can use the conductive line L as a common word line or a common bit line, and a memory operation can be easily controlled.

[2-4] Layouts of First and Second Control Circuits

Figure 6:
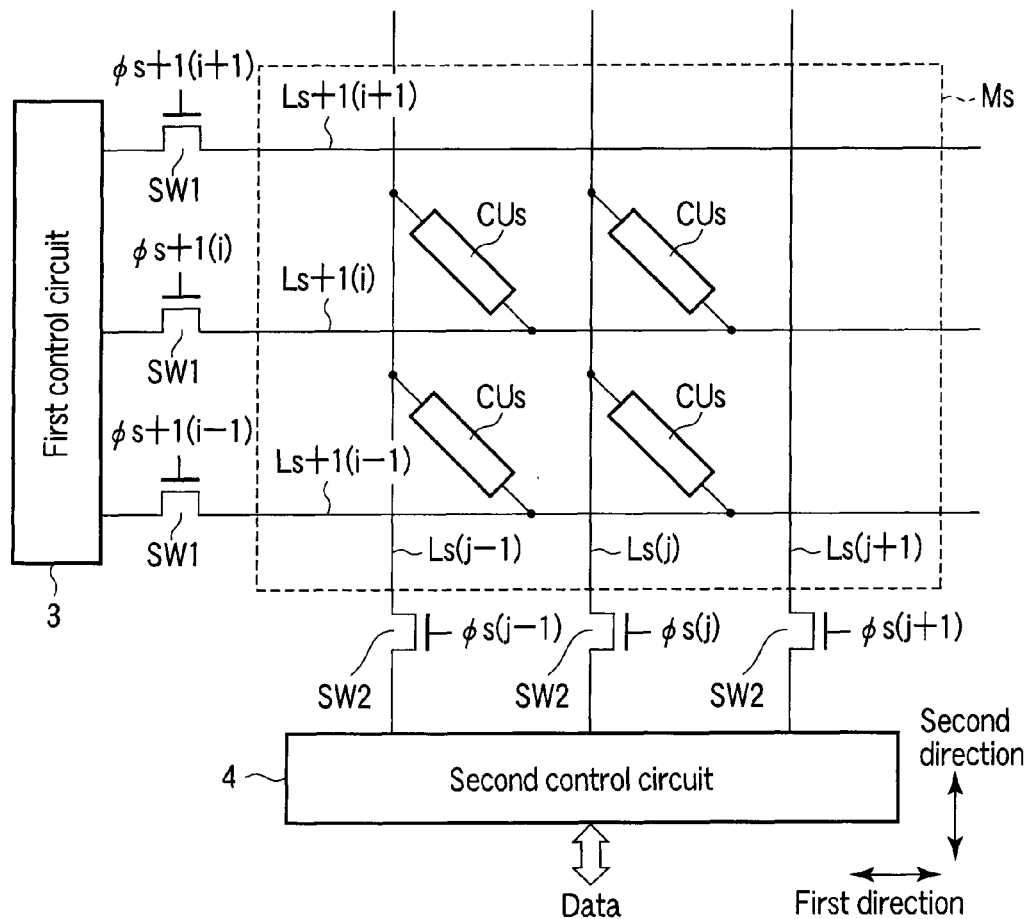
FIG. 6 is a diagram illustrating a first example of the layout of first and second control circuits in the embodiment.
Figure 7:
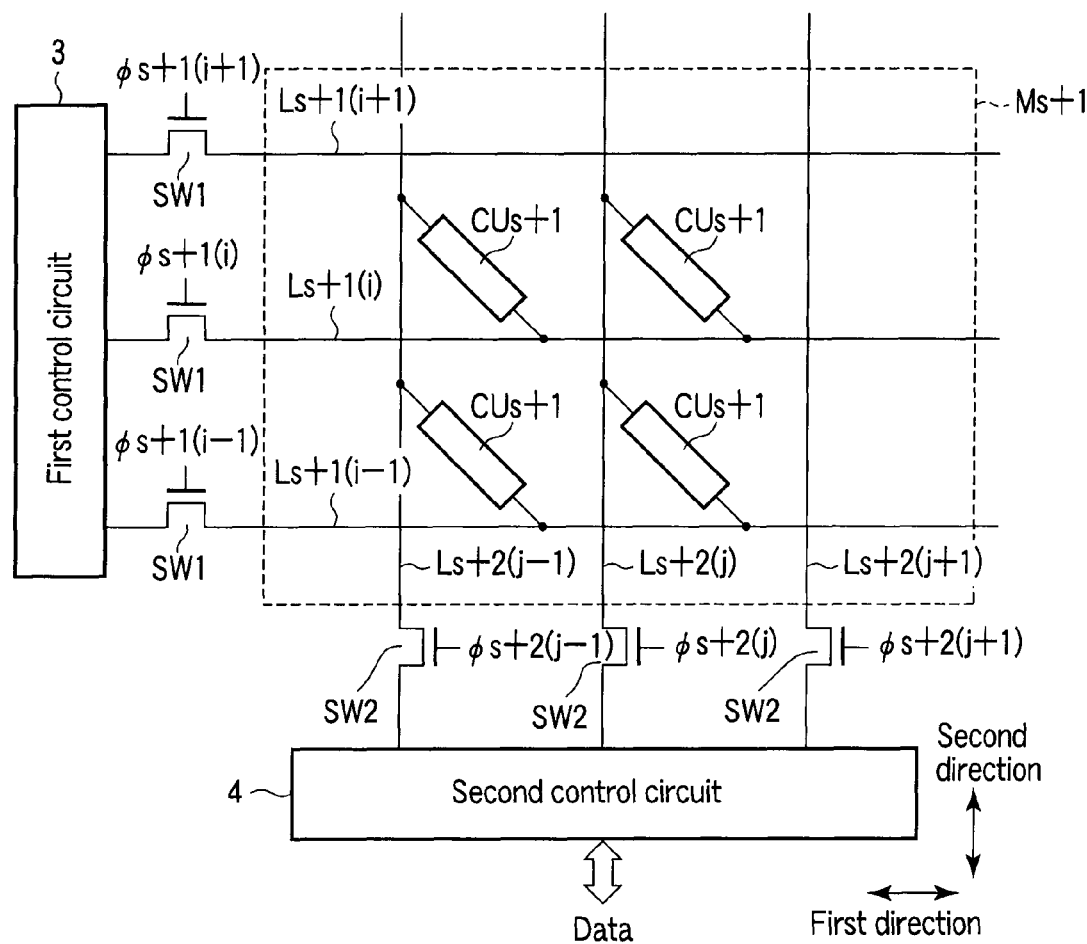
FIG. 7 is a diagram illustrating a first example of the layout of the first and second control circuits in the embodiment.

FIGS. 6 and 7 illustrate a first example of layouts of the first and second control circuits in the embodiment.

A memory cell array Ms corresponding to any one of memory cell arrays M1 to M4 illustrated in FIG. 2 is configured by a plurality of cell units CUs arranged in the form of an array as illustrated in FIG. 6. One end of each of cell units CUs is connected to conductive lines Ls($j$−1), Ls($j$), and Ls($j$+1), and the other ends are connected to conductive lines Ls+1($i$−1), Ls+1($i$), and Ls+1($i$+1).

A memory cell array Ms+1, as illustrated in FIG. 7, is configured by a plurality of cell units CUs+1 arranged in the form of an array. One end of each of cell units CUs+1 is connected to conductive lines Ls+1($i$−1), Ls+1($i$), and Ls+1($i$+1), and the other ends are connected to conductive lines Ls+2($j$−1), Ls+2($j$), and Ls+2($j$+1).

The subscript s denotes 1, 3, 5, 7, etc.

The first control circuit 3 is connected to one set of ends of conductive lines Ls+1($i$−1), Ls+1($i$), and Ls+1($i$+1) in one direction through switch circuits SW1. Switch circuit SW1, for example, is configured by an N-channel field-effect transistor (FET) controlled by control signals Φs+1($i$−1), Φs+1($i$), and Φs+1($i$+1).

The second control circuit 4 is connected to one set of ends of conductive lines Ls($j$−1), Ls($j$), and Ls($j$+1) in a second direction through switch elements SW2. Switch circuit SW2, for example, is configured by an N-channel FET controlled by control signals Φs($j$−1), Φs($j$), and Φs($j$+1).

The second control circuit 4 is connected to one set of ends of conductive lines Ls+2($j$−1), Ls+2($j$), and Ls+2($j$+1) in the second direction through switch elements SW2. Switch circuit SW2, for example, is configured by an N-channel FET controlled by control signals Φs+2($j$−1), Φs+2($j$), and Φs+2($j$+1).

Figure 8:
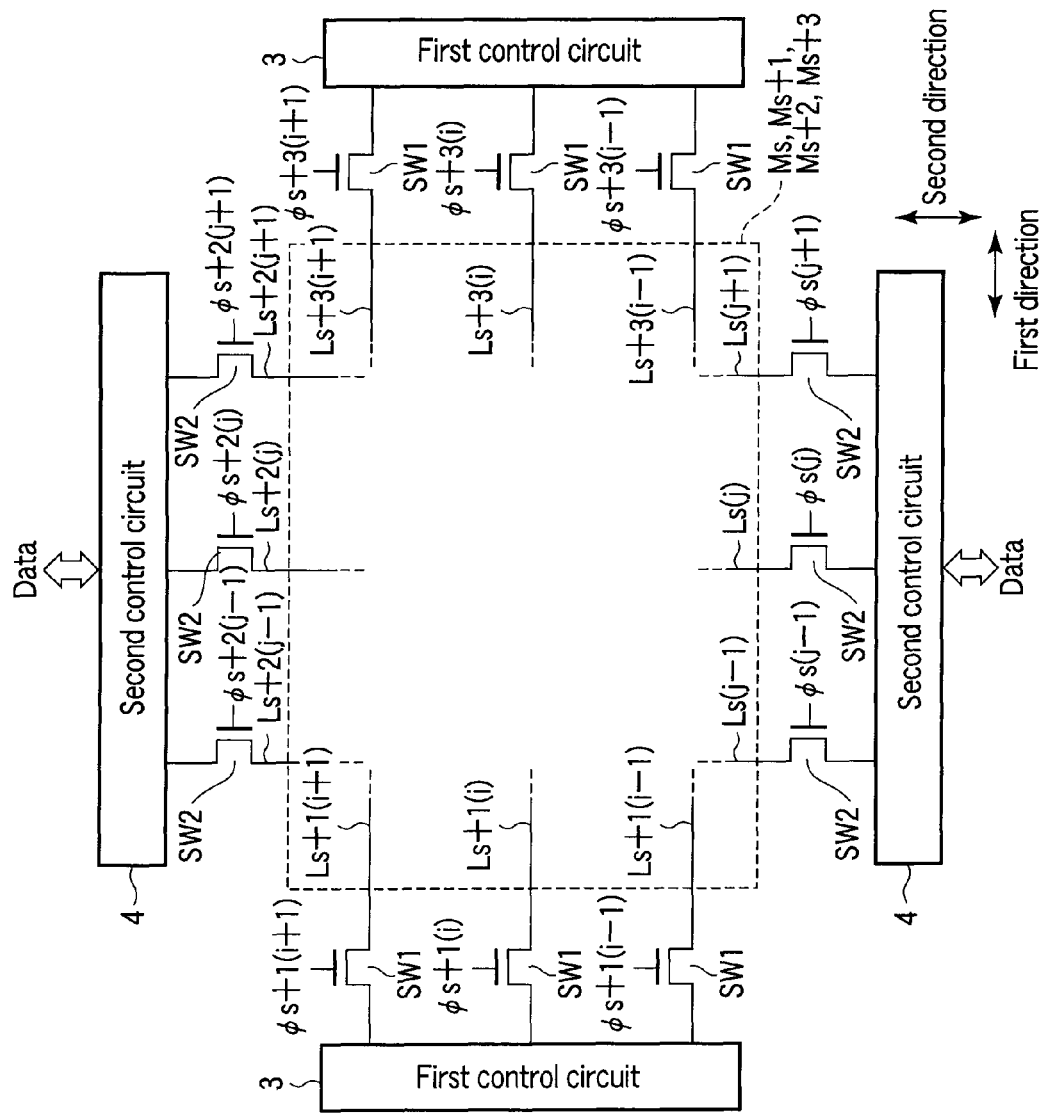
FIG. 8 is a diagram illustrating a second example of the layout of the first and second control circuits in the embodiment.

FIG. 8 illustrates a second example of the layouts of the first and second control circuits in the embodiment.

The layout of the second example is different from that of the first example except that the first control circuits 3 are arranged at both sets of ends of memory cell arrays Ms, Ms+1, Ms+2, and Ms+3 in one direction, respectively, and the second control circuits 4 are arranged at both sets of ends of memory cell arrays Ms, Ms+1, Ms+2, and Ms+3 in the second direction, respectively.

The subscript s denotes 1, 5, 9, 13, etc.

The first control circuits 3 are connected to both sets of ends of conductive lines Ls+1($i$−1), Ls+1($i$), and Ls+1($i$+1) in one direction through switch elements SW1, respectively. Switch circuit SW1 is configured by an N-channel FET controlled by control signals Φs+1($i$−1), Φs+1($i$), Φs+1($i$+1), Φs+3($i$−1), Φs+3($i$) and Φs+3($i$+1).

The second control circuits 4 are connected to both sets of ends of conductive lines Ls($j$−1), Ls($j$), and Ls($j$+1) in the second direction through switch elements SW2, respectively. Switch circuit SW2, for example, is configured by an N-channel FET controlled by control signals Φs($j$−1), Φs($j$), Φs($j$+1), Φs+2($j$−1), Φs+2($j$) and Φs+2($j$+1).

[2-5] Operation

An operation on the above resistance-change memory will be described.

Figure 9:
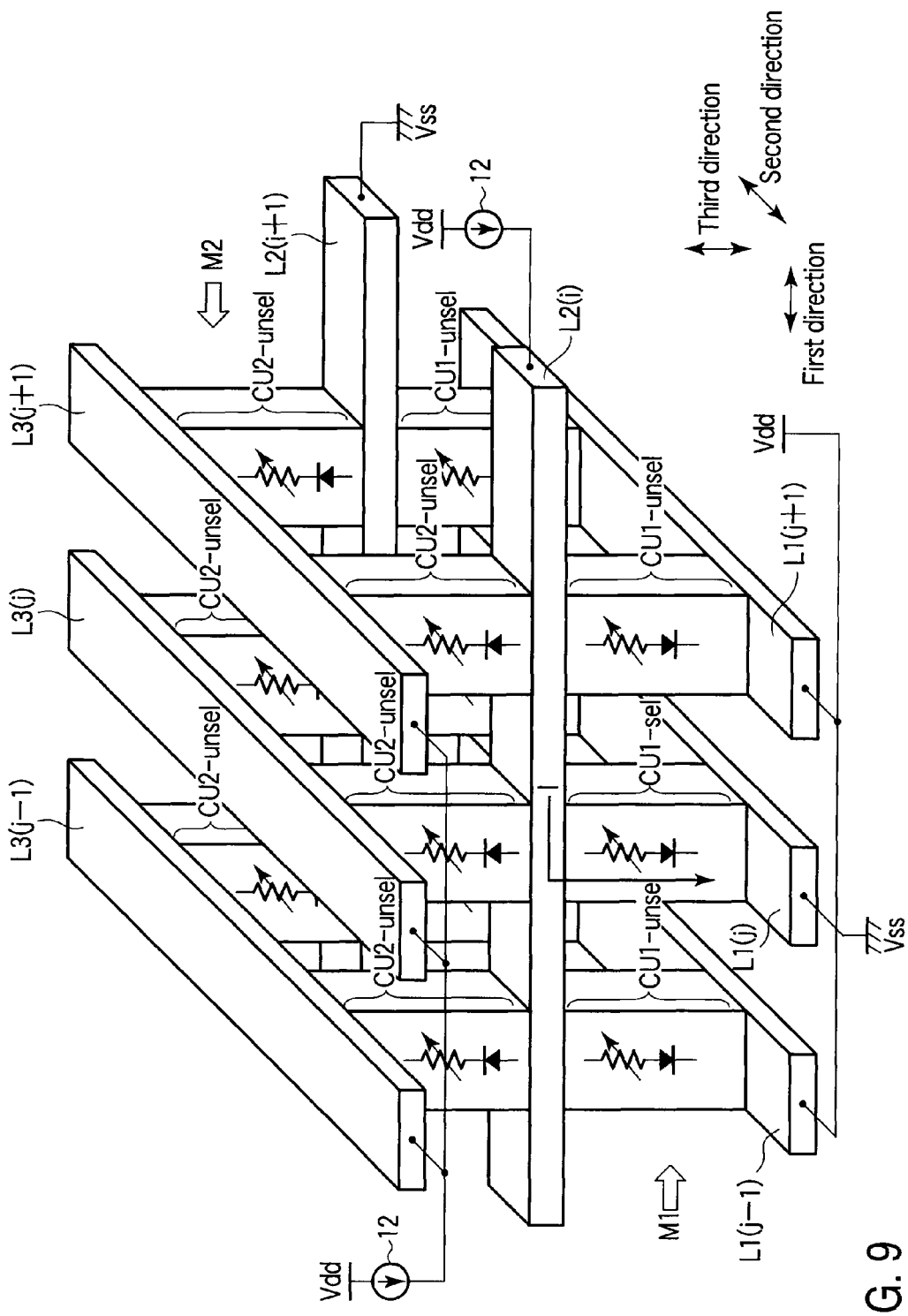
FIG. 9 is a perspective view of two memory cell arrays in the embodiment.

FIG. 9 is a perspective view of two memory cell arrays in the embodiment.

A memory cell array M1 corresponds to memory cell array M1 in FIG. 2, and a memory cell array M2 corresponds to memory cell array M2 in FIG. 2.

A connection relationship between memory elements and rectifier elements in cell units CU1 and CU2 corresponds to a in FIG. 4.

A. Set Operation

The case in which a write (set) operation is performed on a selected cell unit CU1-sel in memory cell array M1 will be described first.

An initial state of the selected cell unit CU1-sel is an erase (reset) state.

The reset state is a high-resistance state (100 kΩ to 1 MΩ), and the set state is a low-resistance state (1 to 10 kΩ).

A selected conductive line L2($i$) is connected to a power supply potential Vdd on the high-potential side, and a selected conductive line L1($j$) is connected to a power supply potential Vss on the low-potential side.

Of the first conductive lines from the semiconductor substrate side, remaining unselected conductive lines L1(j−1) and L(j+1), but not selected conductive line L1(j), are connected to the power supply potential Vdd. Of the second conductive lines from the semiconductor substrate side, remaining unselected conductive line L2(i+1), but not selected conductive line L2(i), is connected to the power supply potential Vss.

Furthermore, the third unselected conductive lines L3(j−1), L3(j), and L3(j+1) from the semiconductor substrate side are connected to the power supply potential Vdd.

At this time, since a forward bias is applied to a rectifier element (diode) in the selected cell unit CU1-sel, a set current I-set from a constant current flows into the selected cell unit CU1-sel, and the resistance of a memory element in the selected cell unit CU1-sel is changed from the high- to the low-resistance state.

In this case, in the set operation, a voltage of 1 to 2 V is applied to the memory element in the selected cell unit CU1-sel, a current density of the set current I-set flowing into the memory element (high-resistance state) is set to a value ranging from $1\times10^5$ to $1\times10^7$ A/cm$^2$.

In contrast, in the unselected cell units CU1-unsel in memory cell array M1, rectifier elements (diodes) in cell units connected between unselected conductive lines L1(j−1) and L1(j+1) and unselected conductive line L2(i+1) are reverse biased.

Similarly, in the unselected cell units CU2-unsel in memory cell array M2, rectifier elements (diodes) in cell units connected between unselected conductive line L2(i+1) and unselected lines L3(j−1), L3(j), and L3(j+1) are reverse biased.

Therefore, the rectifier elements in the cell units require characteristics of having a sufficiently small current when reverse biased and a sufficiently high breakdown voltage.

B. Reset Operation

The case in which an erase (reset) operation is performed on the selected cell unit CU1-sel in memory cell array M1 will be described.

Selected conductive line L2(i) is connected to the power supply potential Vdd on a high-potential side, and selected conductive line L1(j) is connected to the power supply potential Vss on a low-potential side.

Of the first conductive lines from the semiconductor substrate side, remaining unselected conductive lines L1(j−1) and L1(j+1), but not selected conductive line L1(j), are connected to the power supply potential Vdd. Of the second conductive lines from the semiconductor substrate side, remaining unselected conductive line L2(i+1), but not selected conductive line L2(i), is connected to the power supply potential Vss.

Furthermore, the third unselected conductive lines L3(j−1), L3(j), and L3(j+1) from the semiconductor substrate side are connected to the power supply potential Vdd.

At this time, since a forward bias is applied to the rectifier element (diode) in the selected cell unit CU1-sel, a reset current I-reset from a constant current source flows into the selected cell unit CU1-sel, and the resistance of the memory element in the selected cell unit CU1-sel changes from a low- to a high-resistance state.

In this case, in the reset operation, a voltage of 1 to 3 V is applied to the memory element in the selected cell unit CU1-sel, and a current density of the set current I-reset flowing into the memory element (low-resistance state) is set to a value ranging from $1\times10^5$ to $1\times10^7$ A/cm$^2$.

In contrast, in the unselected cell units CU1-unsel in memory cell array M1, rectifier elements (diodes) in cell units connected between unselected conductive lines L1(j−1) and L1(j+1) and unselected conductive line L2(i+1) are reverse biased.

Similarly, in the unselected cell units CU2-unsel in memory cell array M2, rectifier elements (diodes) in cell units connected between unselected conductive line L2(i+1) and unselected lines L3(j−1), L3(j), and L3(j+1) are reverse biased.

Therefore, the rectifier elements in the cell units require characteristics of having a sufficiently small current when reverse biased and a sufficiently high breakdown voltage.

The set current I-set and reset current I-reset are different from each other. Voltages applied to the memory element in the selected cell unit CU1-sel to generate the set current I-set and the reset current I-reset depend on materials constituting the memory element.

C. Read Operation

The case in which a read operation is performed on the selected cell unit CU1-sel in memory cell array M1 will described.

Selected conductive line L2(i) is connected to the power supply potential Vdd on a high-potential side, and selected conductive line L1(j) is connected to the power supply potential Vss on a low-potential side.

Of the first conductive lines from the semiconductor substrate side, remaining unselected conductive lines L1(j−1) and L1(j+1), but not selected conductive line L1(j), are connected to the power supply potential Vdd. Of the second conductive lines from the semiconductor substrate side, remaining unselected conductive line L2(i+1), but not selected conductive line L2(i), is connected to the power supply potential Vss.

Furthermore, the third unselected conductive lines L3(j−1), L3(j), and L3(j+1) from the semiconductor substrate side are connected to the power supply potential Vdd.

At this time, since a forward bias is applied to the rectifier element (diode) in the selected cell unit CU1-sel, a reset current I-reset from a constant current source flows into a memory element (high- or low-resistance state) in the selected cell unit CU1-sel.

Therefore, for example, when a change in potential of a sense node is detected when a read current I-read flows in the memory element, data (resistance) in the memory element can be read.

In this case, the value of the read current I-read must be sufficiently smaller than the value of the set current I-set and the value of the reset current I-reset not to change the resistance of the memory element in a read state.

Also in the read state, as in the set/reset state, in the unselected cell units CU1-unsel in memory cell array M1, rectifier elements (diodes) in cell units connected between unselected conductive lines L1(j−1) and L1(j+1) and unselected conductive line L2(i+1) are reverse biased.

In the unselected cell units CU2-unsel in memory cell array M2, rectifier elements (diodes) in cell units connected between unselected conductive line L2(i+1) and unselected lines L3(j−1), L3(j), and L3(j+1) are reverse biased.

Therefore, the rectifier elements in the cell units require characteristics of having a sufficiently small current when reverse biased and a sufficiently high breakdown voltage.

[2-6] Memory Element and Rectifier Element

A cell unit (memory element and rectifier element) used in a resistance-change memory according to the embodiment of the present invention will be described in detail. As a connection relationship between a memory element and a rectifier element in the cell unit, a in FIG. 4 is exemplified.

Figure 10:
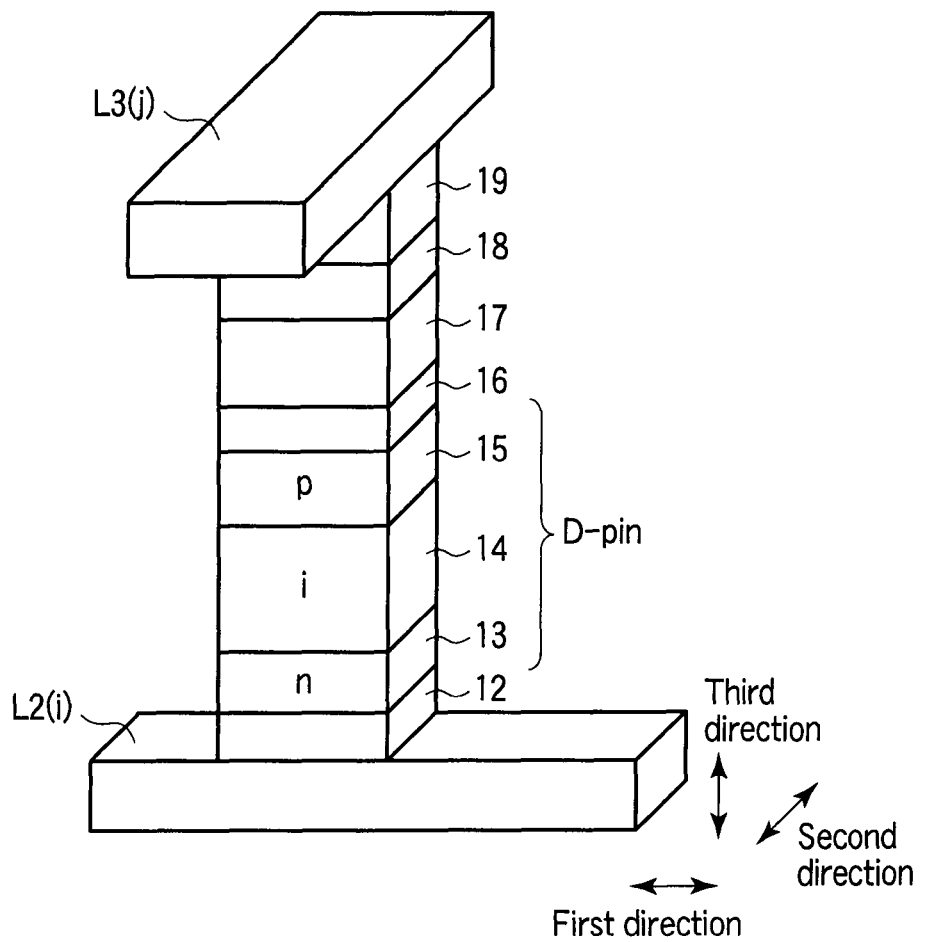
FIG. 10 is a perspective view illustrating a structure of a unit cell in the embodiment.

FIG. 10 is a perspective view illustrating a structure of one cell unit in the embodiment.

On conductive line L2(i) extending in a first direction, an electrode layer 12, an n-type semiconductor layer 13, an intrinsic semiconductor layer 14, a p-type semiconductor layer 15, and an electrode layer 16 are sequentially stacked.

The intrinsic semiconductor layer 14 means a semiconductor layer in which an impurity is undoped or a semiconductor layer containing an extremely small amount of impurity which can be neglected with respect to an intrinsic carrier density. More specifically, the intrinsic semiconductor layer is a semiconductor in which a conduction electron density is equal to a hole density and ideally defined as a semiconductor which does not contain an impurity at all. However, even though the semiconductor layer contains an extremely small amount of p- or n-type impurity, when the concentration of the impurity is regarded as a density which is considerably lower than the intrinsic carrier density, the semiconductor layer is handled as an intrinsic semiconductor layer.

A silicon p-i-n diode D-pin serving as a rectifier element is configured by the n-type semiconductor layer 13, the intrinsic semiconductor layer 14, and the p-type semiconductor layer 15.

On the electrode layer 16, a memory element 17 configured by a variable resistance element or a phase-change element and an electrode layer 18 are sequentially stacked.

Furthermore, a mask material 19 consisting of a conductor is arranged on the electrode layer 18, conductive line L3(j) extending in a second direction crossing the first direction is arranged on the mask material 19. The mask material 19 is used as a mask in the steps of forming the layers 12 to 18, and may not be formed.

A. Comparative Example

A structure in which the plurality of cell units illustrated in FIG. 10 are arranged on a substrate, and an insulating interlayer, for example, a silicon oxide film is buried in an area between the cell units is formed. In the structure, an impurity such as fluorine or hydrogen is diffused from the silicon oxide film into the memory element 17, the characteristics of the memory element 17 may be degraded.

For this reason, a structure in which the side surface of the memory element 17 is covered with a silicon nitride film to prevent the impurity such as fluorine or hydrogen from being diffused into the memory element 17 is used.

However, in case the silicon nitride film is formed on the side surface of the rectifier element, i.e., the p-i-n diode D-pin (n-type semiconductor layer 13, intrinsic semiconductor layer 14, and p-type semiconductor layer 15), reverse current increases, and the rectification characteristic of the rectifier element is degraded.

Figure 11:
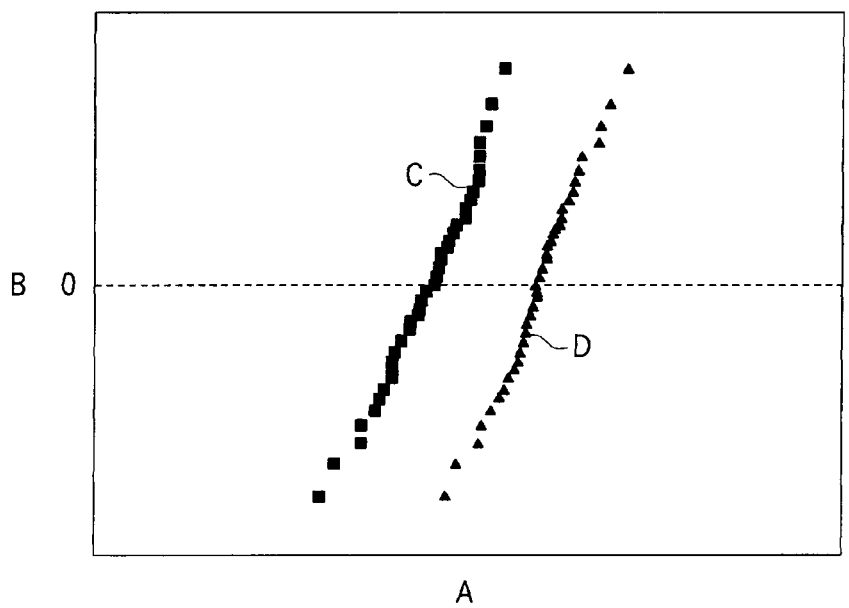
FIG. 11 is a diagram illustrating a change of reverse current depending on the presence/absence of a silicon nitride film in a comparative example.

FIG. 11 illustrates a change in reverse current caused by the presence/absence of the silicon nitride film on the side surface of the rectifier element. FIG. 11 is a diagram, i.e., a Weibull plot showing a dispersion of the reverse current obtained when a predetermined reverse-polarity voltage is applied to a predetermined number of rectifier elements. The abscissa ("A" in FIG. 11) in FIG. 11 represents reverse current A, and the ordinate ("B" in FIG. 11) in FIG. 11 represents the dispersion of data.

A plot group (plot group C) indicated by C in FIG. 11 illustrates the case in which a silicon nitride film is not formed on the side surface of the p-i-n diode D-pin, and a plot group (plot group D) indicated by D shows the case in which a silicon nitride film is formed on the side surface of the p-i-n diode D-pin. In comparison between the plot group C and the plot group D, it is easily understood that the reverse current occurring when the silicon nitride film is formed on the side surface of the p-i-n diode D-pin is larger than that occurring when no silicon nitride film is formed.

B. Embodiment

In accordance with the embodiment of the present invention, in order to suppress increase of the reverse current in the rectifier element described above, a silicon oxide film is formed on the side surface of the rectifier element. In order to prevent the impurity such as fluorine or hydrogen from being diffused into the memory element 17, a silicon nitride film is formed on the side surface of the memory element 17. Furthermore, a silicon oxide film formed on the side surface of the rectifier element may be covered with a silicon nitride. In this manner, the impurity such as fluorine or hydrogen can be prevented from being diffused from the insulating interlayer into the rectifier element.

A structure of the cell unit according to the embodiment will be described below in detail.

Figure 12A:
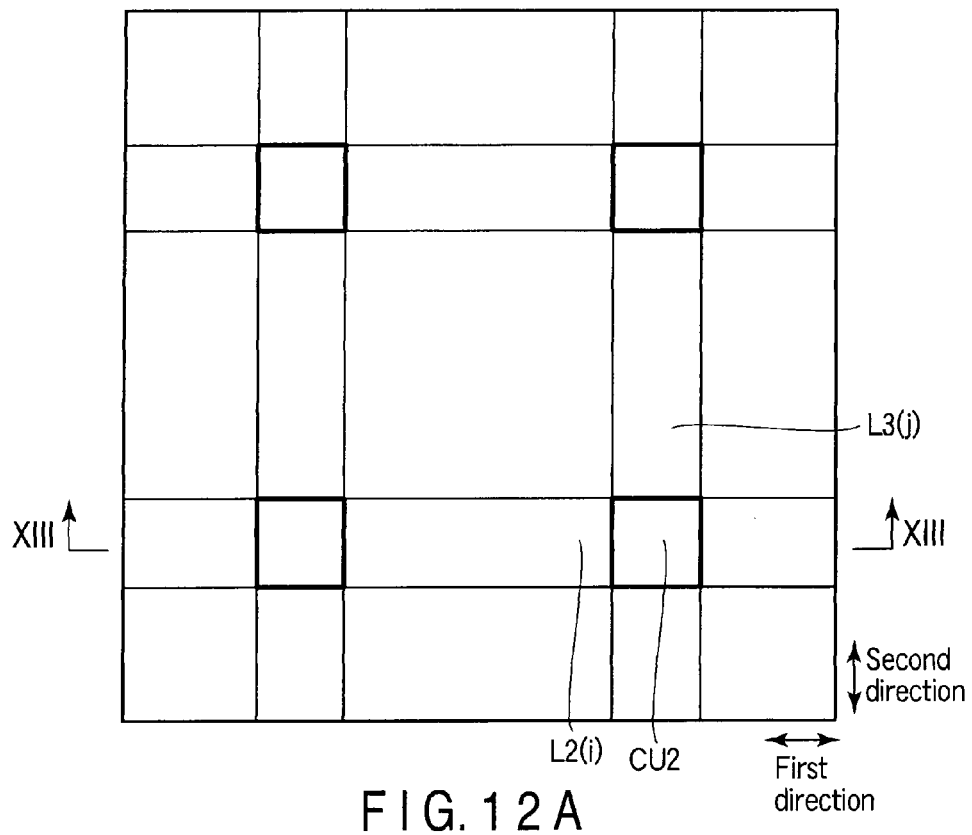
FIG. 12A is an upper view of the cell unit according to the embodiment.
Figure 12B:
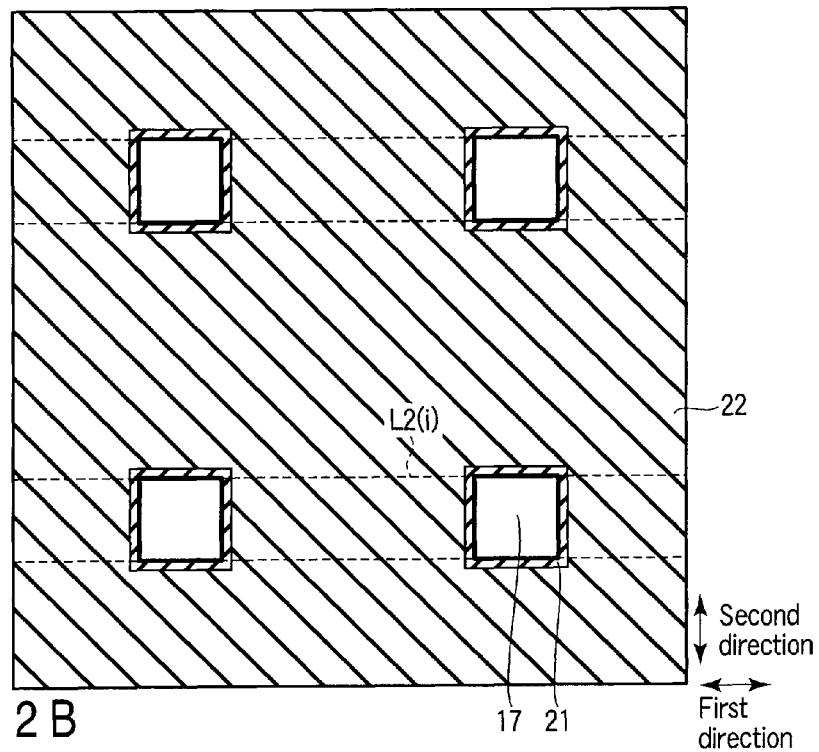
FIG. 12B is a sectional diagram of the cell unit according to the embodiment.
Figure 12C:
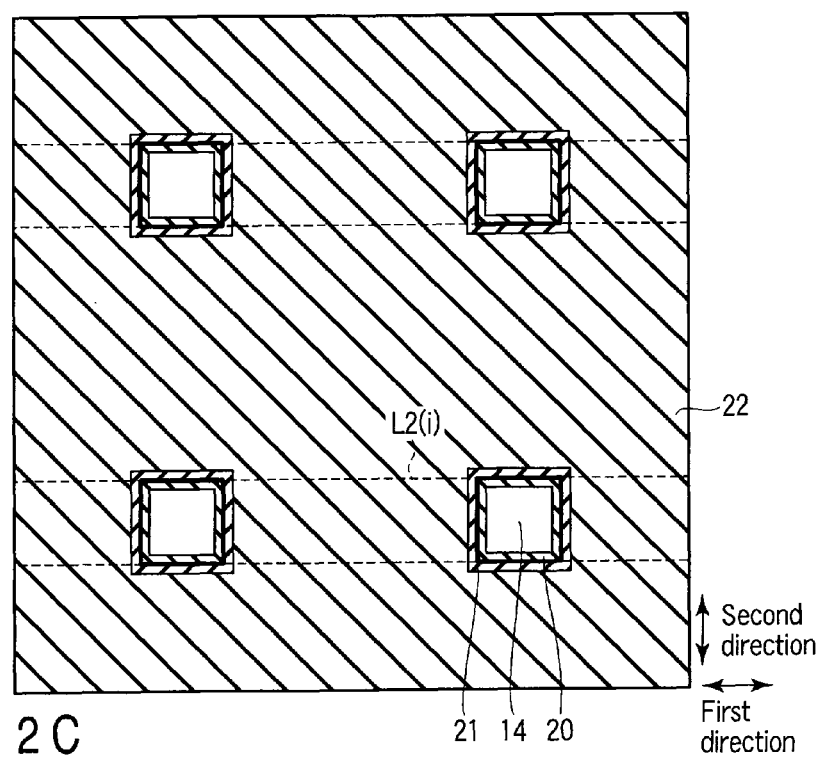
FIG. 12C is a sectional diagram of the cell unit according to the embodiment.
Figure 13:
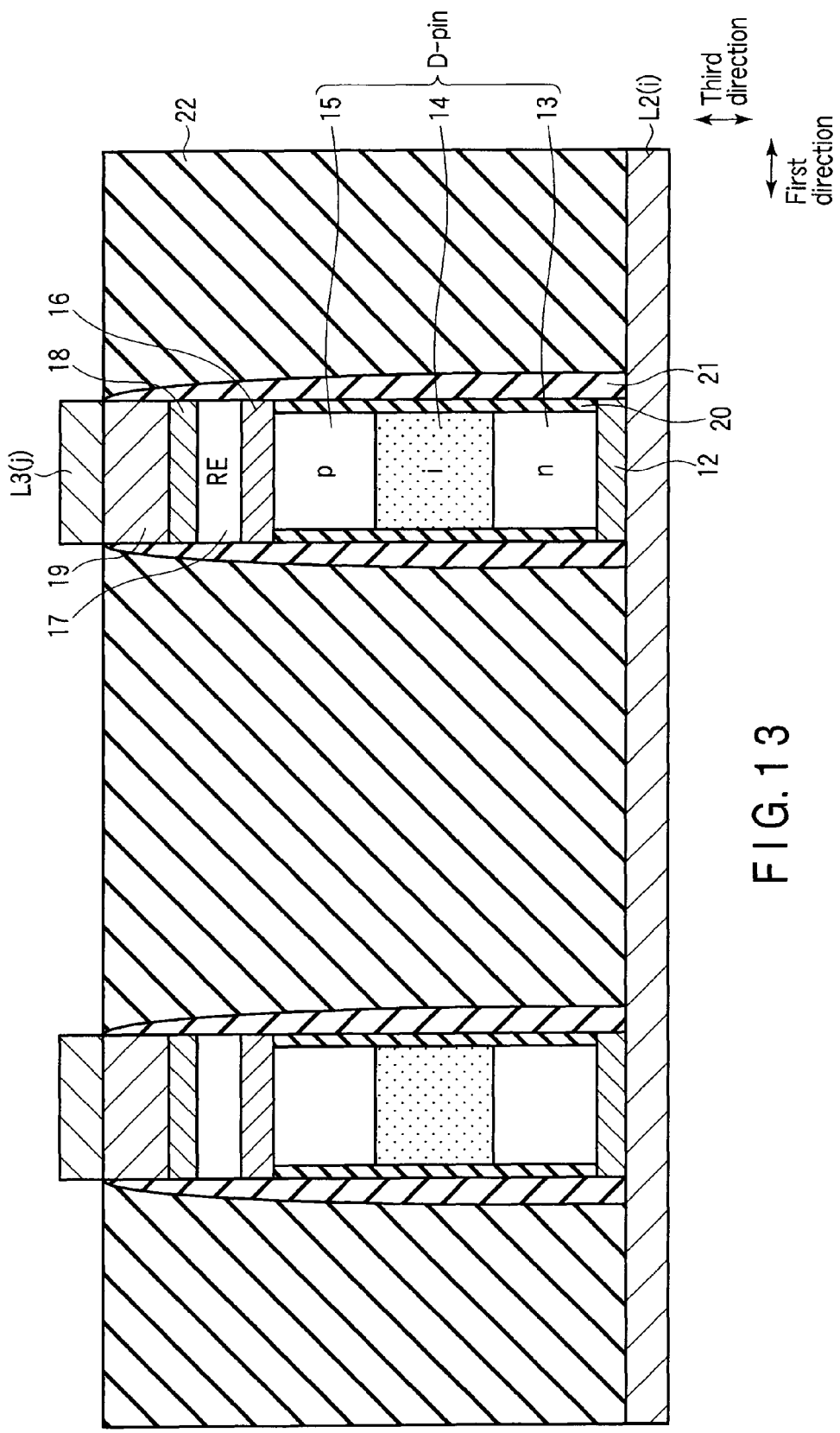
FIG. 13 is a sectional diagram of the cell unit according to the embodiment.

FIG. 12A is a diagram illustrating a cell unit configured by a memory element and a rectifier element in the embodiment when viewed from the top. Although a conductive line L2(j) extending in the first direction is not seen from the top, conductive line L2(j) is illustrated in FIG. 12A for the sake of convenience. FIG. 12B is a sectional view of an memory element portion cut along planes parallel to the first direction and the second direction of the cell unit configured by the memory element and the rectifier element in the embodiment. FIG. 12C is a sectional view of a rectifier element portion cut along planes parallel to the first direction and the second direction of the cell unit configured by the memory element and the rectifier element in the embodiment. FIG. 13 is a sectional view of a cell unit along line XIII-XIII in FIG. 12A.

As illustrated in FIG. 12A, a cell unit CU2 is arranged at a crossing portion between conductive line L3(j) and conductive line L2(j). As illustrated in FIG. 12B, a silicon nitride film 21 is arranged on the entire side surface of the memory element 17 to surround the circumference of the memory element 17. Furthermore, as illustrated in FIG. 12C, a silicon oxide film 20 is arranged on the entire side surface of the p-i-n diode D-pin to surround the circumference of the p-i-n diode D-pin (in FIG. 12C, as a typical example, the intrinsic semiconductor layer 14 is illustrated). And the silicon nitride film 21 is arranged on the entire side surface of the silicon oxide film 20.

As illustrated in FIG. 13, on conductive line L2(i) extending in the first direction, the electrode layer 12, the n-type semiconductor layer 13, the intrinsic semiconductor layer 14, the p-type semiconductor layer 15, and the electrode layer 16 are sequentially stacked. The p-i-n diode D-pin serving as a rectifier element is configured by the n-type semiconductor layer 13, the intrinsic semiconductor layer 14, and the p-type semiconductor layer 15.

The concentration of an n-type impurity contained in the n-type semiconductor layer 13 is set to $1 \times 10^{20}$ atoms/cm$^3$ or more. The concentration of a p-type impurity contained in the p-type semiconductor layer 15 is set to $1 \times 10^{20}$ atoms/cm$^3$ or more. When the concentration of the impurity is set to $1 \times 10^{20}$ atoms/cm$^3$ or more, the leakage current when the rectifier element is reverse biased can be reduced while gaining forward current.

The n-type semiconductor layer 13 has a film thickness of about 3 to 30 nm, the intrinsic semiconductor layer 14 has a film thickness of 60 to 120 nm or more, and the p-type semiconductor layer 15 has a film thickness of about 3 to 30 nm.

On the electrode layer 16, the memory element (RE) 17 configured by a variable resistance element or a phase-change element and the electrode layer 18 are sequentially stacked. Furthermore, the mask material 19 is arranged on the electrode layer 18, and conductive line L3(j) extending in the second direction crossing the first direction is arranged on the mask material 19.

On the side surface of the p-i-n diode D-pin, i.e., the side surfaces of the n-type semiconductor layer 13, the intrinsic semiconductor layer 14, and the p-type semiconductor layer 15, the silicon oxide film 20 is formed.

On the side surface of the memory element 17, the side surfaces of the electrode layers 16 and 18, and the side surface of the mask material 19, the silicon nitride film 21 is formed. Furthermore, on the silicon oxide film 20 on the side surface of the p-i-n diode D-pin, the silicon nitride film 21 is formed to cover the silicon oxide film 20. A film thickness of the silicon oxide film 20 is 10 nm or less, and a film thickness of the silicon nitride film 21 is 10 nm or less. In this case, the silicon nitride film 21 continuously covers the side surface of the memory element 17 to the side surface of the silicon oxide film 20.

More specifically, a double-sidewall film configured by the silicon oxide film 20 and the silicon nitride film 21 is formed on the side surface of the p-i-n diode D-pin, and a single-sidewall film configured by the silicon nitride film 21 is formed on the side surface of the memory element 17.

When the p-i-n diode D-pin and the memory element 17 are cut along planes parallel to the first direction and the second direction, a sectional area of the p-i-n diode D-pin is smaller than a sectional area obtained when the memory element 17 or the electrode layer 16 is cut along planes parallel to the first direction and the second direction. This is because the silicon oxide film 20 formed on the side surface of the p-i-n diode D-pin is formed by selective oxidation of silicon. With this structure, a current can be caused to flow in the memory element 17 in a wide range, and a current flowing in the memory element 17 can be increased. As a result, a read margin of the memory element 17 is improved.

Around the cell unit, an insulating interlayer, for example, a coating oxide film 22 is formed. The coating oxide film 22 isolates a plurality of arranged cell units. The coating oxide film 22 is a silicon oxide film formed by coating, and consists of, for example, polysilazane or the like.

In the cell unit having the structure illustrated in FIG. 13, the silicon oxide film 20 is formed on the side surface of the rectifier element (p-i-n diode), and the silicon nitride film 21 is formed on the silicon oxide film 20 to cover the silicon oxide film 20. In this manner, increase of the reverse current occurring when the silicon nitride film is directly contacting to the side surface of the rectifier can be suppressed. This is because electric charges trapped by the silicon nitride film 21 are larger than electric charges trapped by the silicon oxide film 20 in number. In contrast, in case the silicon oxide film 20 is not formed, a large reverse current flows through the electric charge traps present on the interface between the rectifier element and the silicon nitride film 21.

Furthermore, since the silicon nitride film 21 is formed on the side surface of the memory element 17, an impurity such as fluorine, hydrogen, or carbon can be prevented from being diffused from the coating oxide film 22 into the memory element 17. In contrast, the silicon oxide film has no impurity diffusion preventing function. In case the side surface is covered with only the silicon oxide film, a variation in the characteristics of the memory element 17 is occurred. In this manner, it is possible to improve a characteristic of the cell unit.

Since the silicon oxide film 20 is formed on the entire side surface to surround the circumference of the rectifier element D-pin, increase of reverse current can be effectively prevented. Since the silicon nitride film 21 is formed on the entire side surface to surround the circumference of the memory element 17, a variation in the characteristics of the memory element 17 can be effectively prevented.

FIGS. 14 to 17 illustrate modifications of the embodiment.

Figure 14:
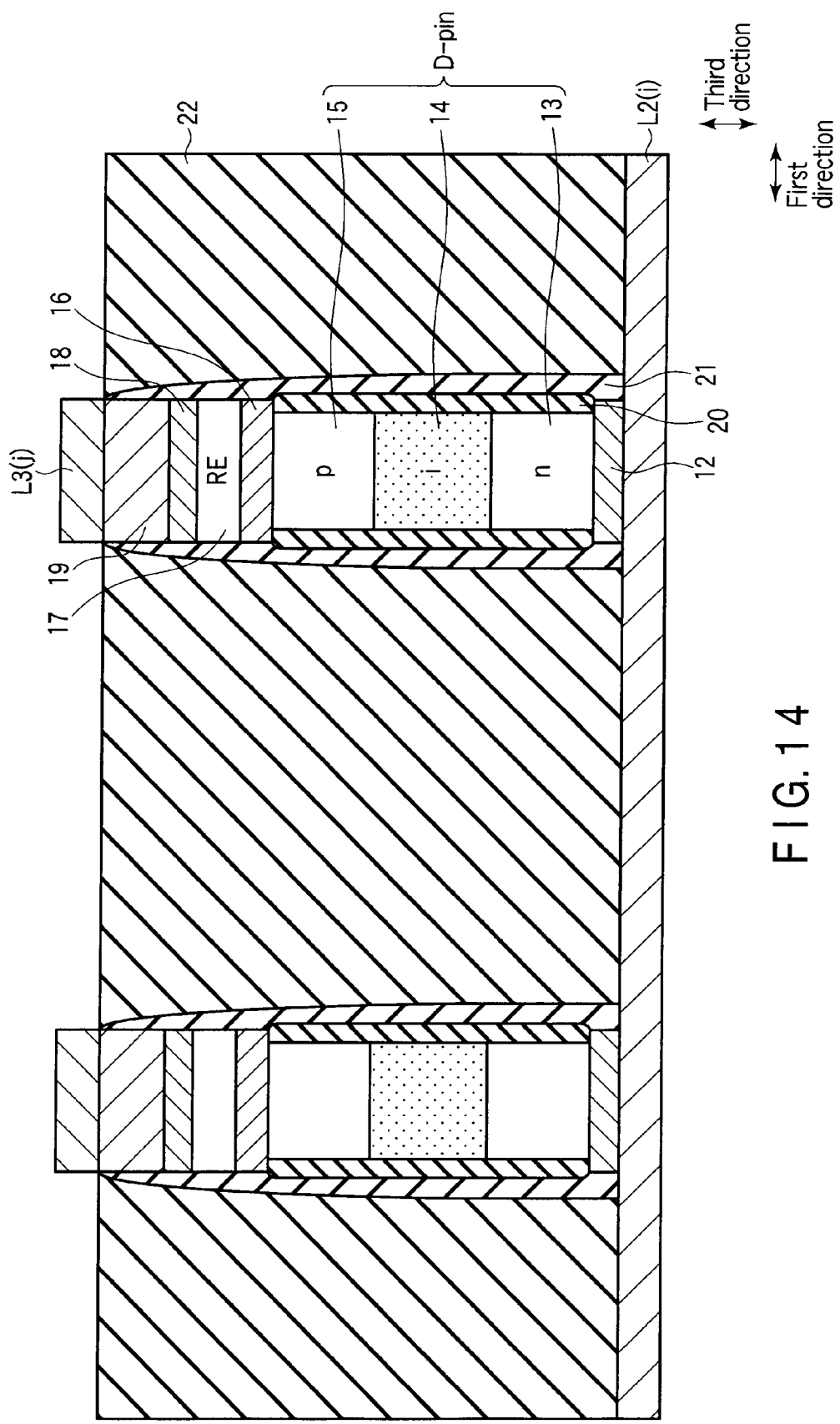
FIG. 14 is a sectional diagram of a first modification of the cell unit in the embodiment.

FIG. 14 illustrates the case in which a rectifier element, i.e., the silicon oxide film 20 formed on the side surface of the p-i-n diode D-pin expand to the outside the side surface of the memory element 17 and the side surfaces of the electrode layers 16 and 18, i.e., the case in which the silicon oxide film 20 is formed to be thick to the outside of the side surface of the memory element 17 and the side surfaces of the electrode layers 16 and 18.

Figure 15:
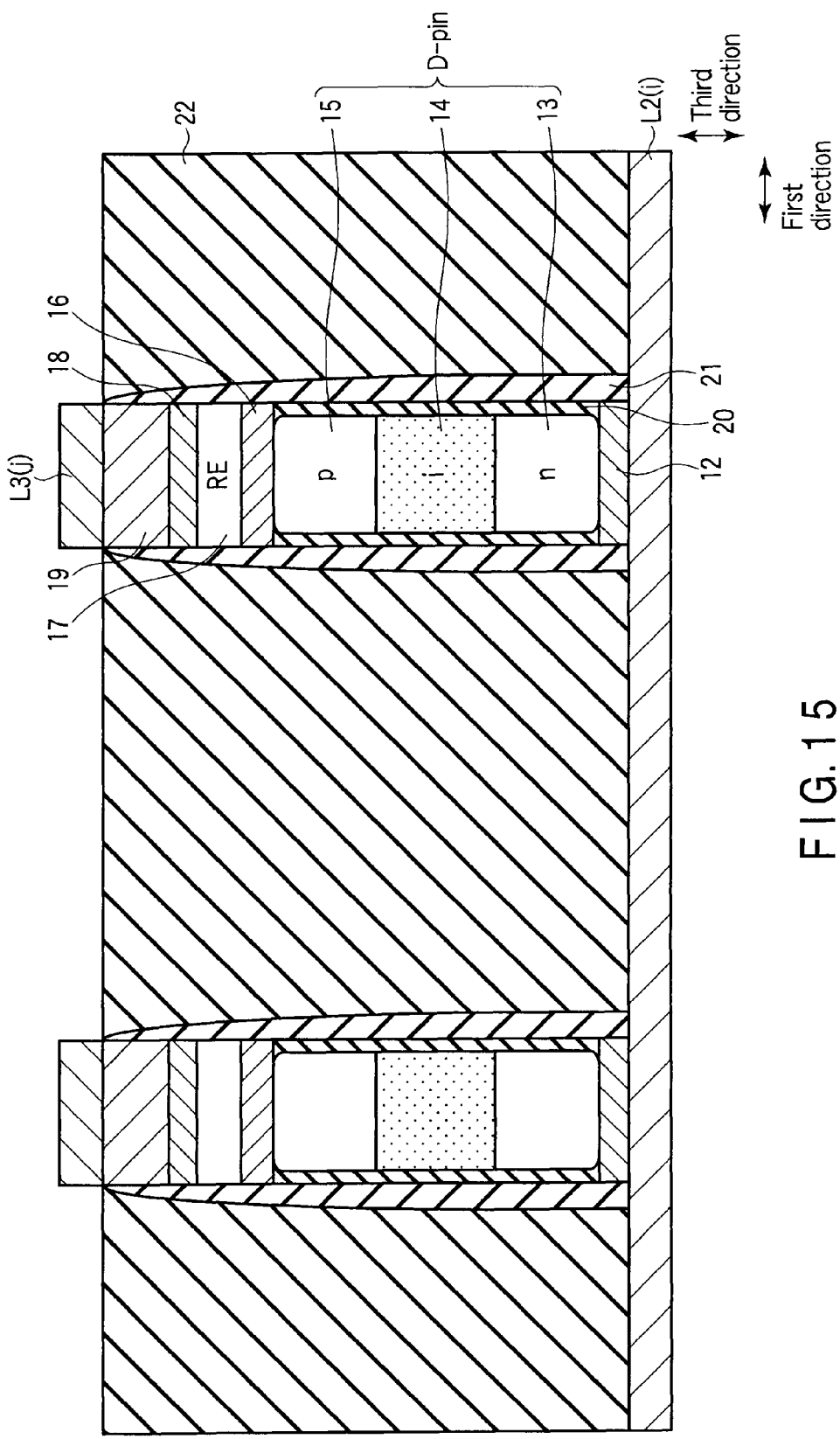
FIG. 15 is a sectional diagram of a second modification of the cell unit in the embodiment.

FIG. 15 illustrates the case in which the silicon oxide film 20 formed on the side surface of the diode D-pin forms a so-called bird's beak (the silicon oxide film 20 is thick inside near the boundary between the electrode layer 16 and the silicon oxide film 20) on a contact surface between the electrode layers 12 and 16.

FIG. 16 illustrates the case in which the silicon oxide film 20 formed on the side surface of the diode D-pin expands to the outside of the side surface of the memory element 17 and the side surfaces of the electrode layers 16 and 18 and forms a bird's beak (the silicon oxide film 20 is thick inside near the boundary between the electrode layer 16 and the silicon oxide film 20) on a contact surface between the electrode layers 12 and 16.

Figure 17:
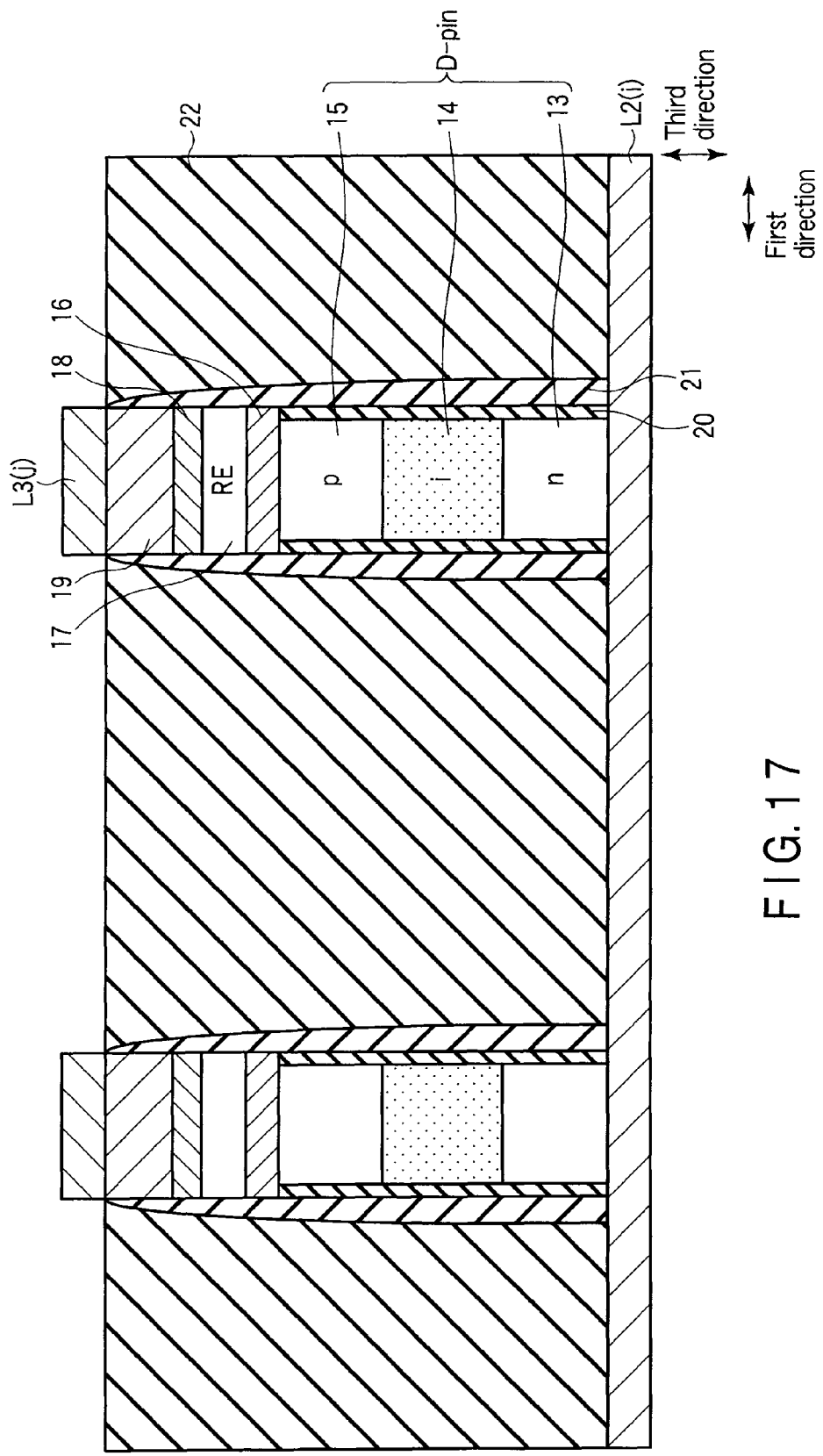
FIG. 17 is a sectional diagram of a fourth modification of the cell unit in the embodiment.

FIG. 17 illustrates the case in which the electrode layer 12 is not formed between conductive line L2(i) and the n-type semiconductor layer 13.

Also in any one of the modifications illustrated in FIGS. 14 to 17, the same effect as that in the embodiment illustrated in FIG. 13 can be obtained.

[2-7] Method of Manufacturing Cell Unit

A method of manufacturing a cell unit according to the embodiment of the present invention will be described. A method of manufacturing a cell unit CU1 formed on the semiconductor substrate 11 is described here.

FIG. 18 is a diagram illustrating a structure of the cell unit according to the embodiment when viewed from the top. FIGS. 19 to 26 are sectional views taken along line XIX-XIX in FIG. 18, and FIGS. 27 to 31 are sectional views taken along line XXVII-XXVII in FIG. 18. FIG. 18 illustrates a plan view of a completed cell unit, and is not always matched with the sectional views of the manufacturing steps illustrated in FIGS. 19 to 31.

As illustrated in FIG. 19, a first conductive layer (for example, tungsten) L1 is formed on the semiconductor substrate 11 by, for example, chemical vapor deposition (CVD). A circuit element such as a MOS transistor or an insulating film may be formed between the first conductive layer L1 and the semiconductor substrate 11.

As illustrated in FIG. 20, the electrode layer (for example, titanium nitride) 12 is formed on the first conductive layer L1 by, for example, CVD or sputtering.

Furthermore, the n-type semiconductor layer 13 obtained by doping an n-type impurity, for example, phosphorous (P) or arsenic (As) in the electrode layer 12 is formed. The cross-point memory cell array 2 formed on the first conductive layer L1 can prevent the first conductive layer L1 and the n-type semiconductor layer 13 from reacting with each other.

Subsequently, the intrinsic semiconductor layer 14 is formed on the n-type semiconductor layer 13 by, for example, CVD. Furthermore, the p-type semiconductor layer 15 obtained by doping a p-type impurity, for example, boron (B), in the intrinsic semiconductor layer 14 is formed.

In this case, the concentration of an n-type impurity contained in the n-type semiconductor layer 13 is set to $1 \times 10^{20}$ atoms/cm$^3$ or more. The concentration of a p-type impurity contained in the p-type semiconductor layer 15 is set to $1 \times 10^{20}$ atoms/cm$^3$ or more. In case the concentration of the impurity is set to $1 \times 10^{20}$ atoms/cm$^3$ or more, the reverse-bias leakage current of the diode formed as described above can be reduced while gaining forward current.

The n-type semiconductor layer 13 has a film thickness of about 3 to 30 nm, the intrinsic semiconductor layer 14 has a film thickness of 60 to 120 nm or more, and the p-type semiconductor layer 15 has a film thickness of about 3 to 30 nm.

As illustrated in FIG. 21, the electrode layer (for example, titanium nitride) 16 is formed on the p-type semiconductor layer 15 by, for example, CVD or sputtering. Furthermore, on the electrode layer 16, the variable resistance film or the phase-change film 17 serving as a memory element (variable resistance element or phase-change element) is formed by, for example, CVD.

Furthermore, the electrode layer (for example, titanium nitride) 18 is formed on the variable resistance film or the phase-change film 17 by, for example, CVD or sputtering. In addition, the mask material (for example, tungsten) 19 constituted by a conductive layer is formed on the electrode layer 18 by means of, for example, CVD.

Figure 22:
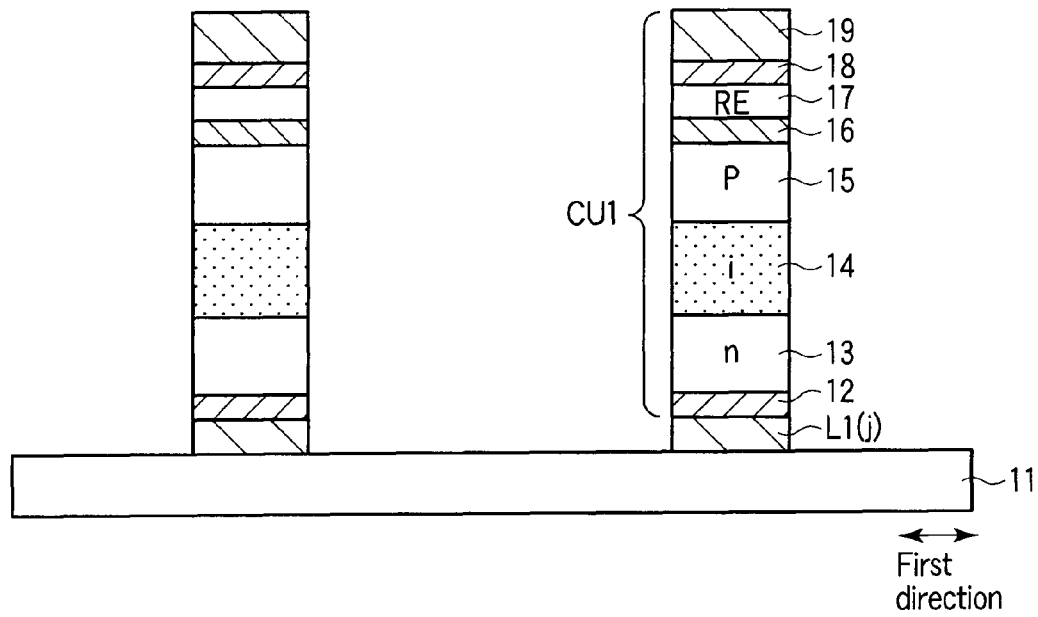

Thereafter, by a lithography method and anisotropic etching (for example, reactive ion etching [RIE]), by using the resist pattern and the mask material 19 as masks in etching, as illustrated in FIG. 22, the mask material 19, the electrode layer 18, the variable resistance film or phase-change film 17, the electrode layer 16, the p-type semiconductor layer 15, the intrinsic semiconductor layer 14, the n-type semiconductor layer 13, the electrode layer 12, and the first conductive layer L1 are sequentially etched.

In this manner, the first conductive layer L1 serves as conductive line L1(j) extending in the second direction, and a side surface of cell unit CU1 facing the first direction is exposed. Conductive line L1(j) serves as, for example, a word line (or a bit line).

Figure 23:
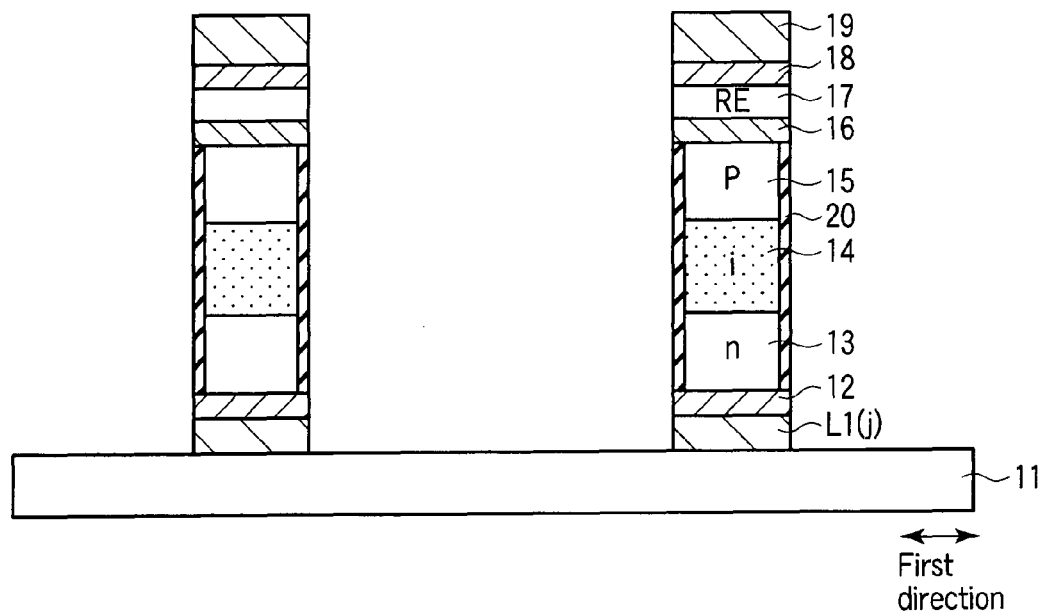

For example, when a thermal oxidation process is performed under the condition in which a water vapor partial ($H_2O$=oxidizing species) pressure in a hydrogen ($H_2$) gas is 3 to 15%, i.e., when selective oxidation is performed, as illustrated in FIG. 23, the silicon oxide film 20 is formed on the side surface of the silicon diode, i.e., only the side surfaces of the p-type semiconductor layer 15, the intrinsic semiconductor layer 14, and the n-type semiconductor layer 13. At this time, the film thickness of the silicon oxide film 20 is 10 nm or less. When the side surface of the silicon diode is oxidized, the silicon diode can be recovered from etching damage occurring when the side surface of cell unit CU1 in the first direction is formed.

In this manner, since the silicon oxide film 20 is formed on only the side surface of the diode by the selective oxidation, in case the diode and the variable resistance film 17 or the electrode layer 16 are cut along planes parallel to the first direction and the second direction, a sectional area of the diode is smaller than a sectional area of the variable resistance film 17 or the electrode layer 16.

Furthermore, since the selective oxidation is used to form the silicon oxide film 20, bird's beaks, as illustrated in FIGS. 15 and 16, may be formed on a contact surface between the silicon oxide film 20 and the electrode layer 12 and a contact surface between the silicon oxide film 20 and the electrode layer 16.

On the structure illustrated in FIG. 23, i.e., on the mask material 19 and the semiconductor substrate 11, the silicon nitride film 21 is formed by, for example, CVD. At this time, a film thickness of the silicon nitride film 21 is 10 nm or less.

Subsequently, the silicon nitride film 21 is etched by anisotropic etching (for example, RIE), and, as illustrated in FIG. 24, the silicon nitride film 21 is left on the side surfaces of the mask material 19, the electrode layer 18, and the variable resistance film or the phase-change film 17, the side surface of the electrode layer 16, the upper surface of the silicon oxide film 20 on the side surface of the diode, and the side surface of conductive line L1(j). More specifically, the silicon nitride film 21 is formed on the side surface of the variable resistance film or the phase-change film 17, and the silicon nitride film 21 is formed on the silicon oxide film 20 to cover the silicon oxide film 20 on the side surface of the diode.

As illustrated in FIG. 25, an insulating interlayer, for example, the coating oxide film 22 is formed on the side surface of cell unit CU1 in the first direction by, for example, spin coating. More specifically, the coating oxide film 22 is formed on the silicon nitride film 21. In other words, the coating oxide film 22 is buried in an area between the structures illustrated in FIG. 24. The coating oxide film 22 is a silicon oxide film formed by coating, and consists of, for example, polysilazane or the like.

Furthermore, an upper surface of the coating oxide film 22 is planarized by means of, for example, CMP, so that the upper surface of the coating oxide film 22 and an upper surface of the mask material 19 are located at almost the same position in the third direction.

As illustrated in FIG. 26, a second conductive layer (for example, tungsten) L2 is formed on the mask material 19 and the coating oxide film 22 by means of, for example, CVD. Furthermore, the electrode layer 12 is formed on the second conductive layer L2 by for example, CVD or sputtering.

The p-type semiconductor layer 15 is formed on the cross-point memory cell array 2 by, for example, CVD. The electrode layer 12 formed on the second conductive layer L2 prevents the second conductive layer L2 and the p-type semiconductor layer 15 from reacting with each other.

Subsequently, the intrinsic semiconductor layer 14 is formed on the p-type semiconductor layer 15 by, for example, CVD. Furthermore, the n-type semiconductor layer 13 is formed on the intrinsic semiconductor layer 14 by means of, for example, CVD.

The electrode layer (for example, titanium nitride) 16 is formed on the n-type semiconductor layer 13 by, for example, CVD or sputtering. Furthermore, the variable resistance film or the phase-change film 17 serving as a memory element (variable resistance element or phase-change element) is formed on the electrode layer 16 by, for example, CVD.

Figure 27:
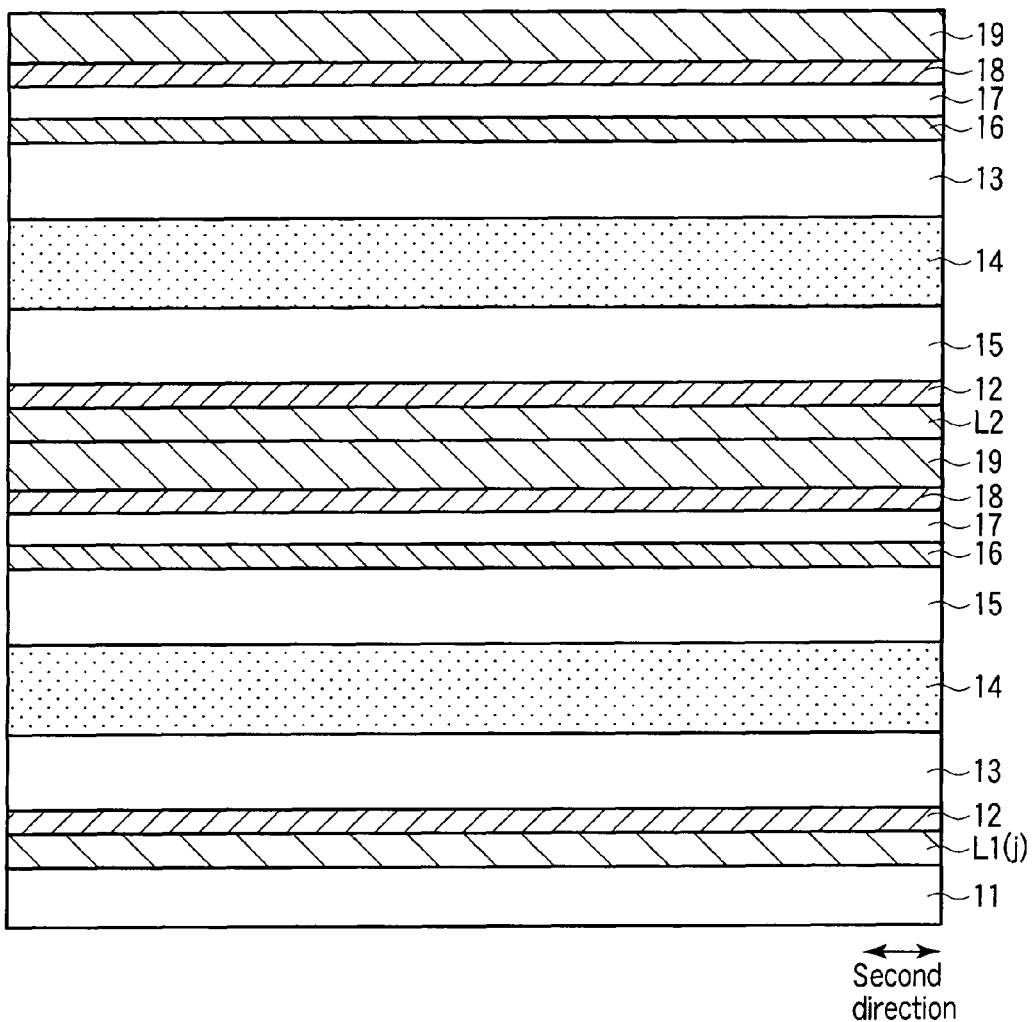

Furthermore, the electrode layer (for example, titanium nitride) 18 is formed on the variable resistance film or the phase-change film 17 by, for example, CVD or sputtering. In addition, the mask material (for example, tungsten) 19 is formed on the electrode layer 18 by, for example, CVD. A section of the structure obtained at this time, taken along line XXVII-XXVII, is illustrated in FIG. 27. After FIG. 27, a section taken along line XXVII-XXVII is obtained.

Figure 28:
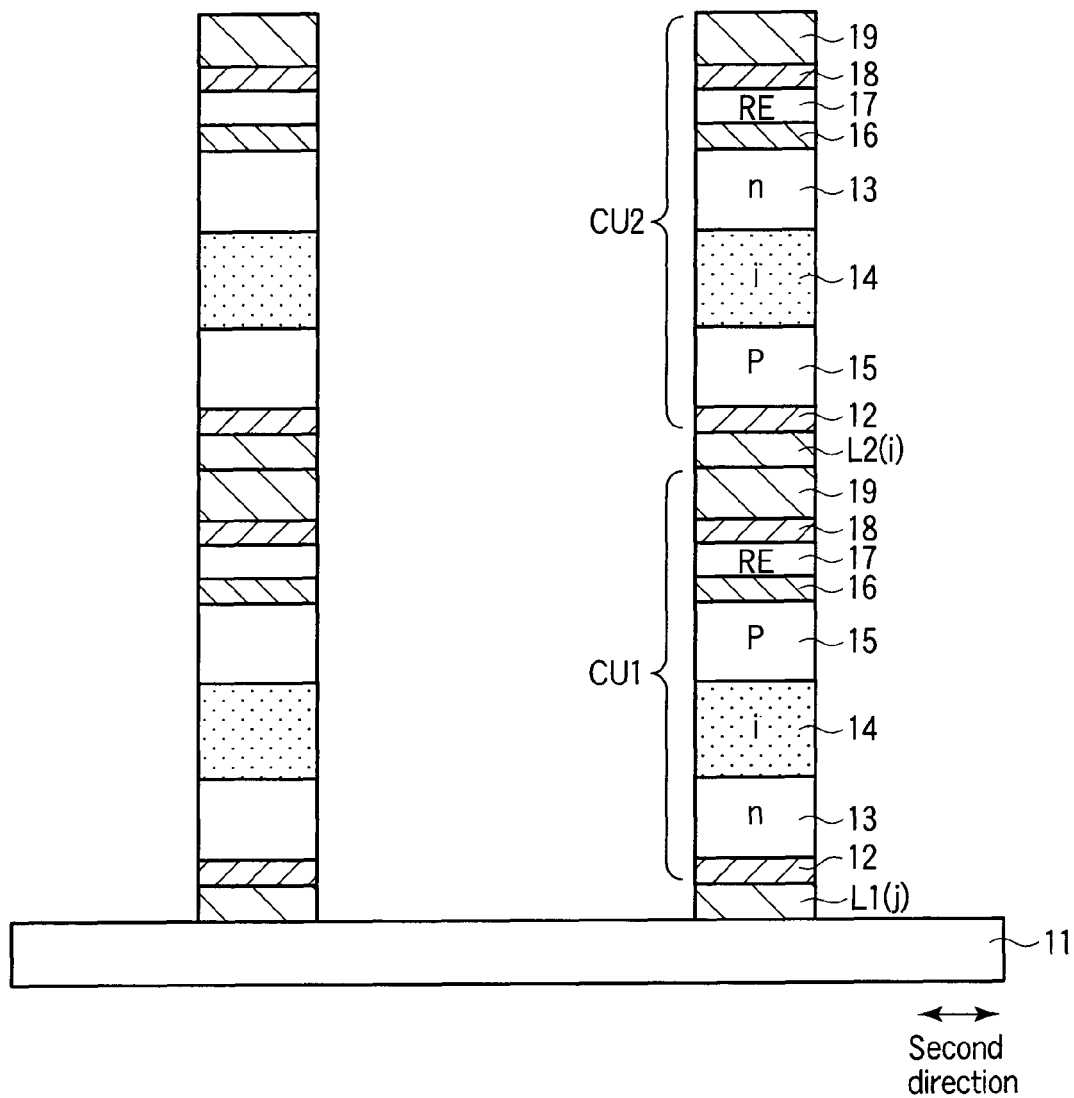

Thereafter, by a lithography method and anisotropic etching (for example, RIE), by using the resist pattern and the mask material 19 as masks in etching, as illustrated in FIG. 28, the mask material 19 to the electrode layer 12 are sequentially etched.

In this manner, the second conductive layer L2 serves as conductive line L2($i$) extending in the first direction, and a side surface of cell unit CU1 facing the first direction the second direction is exposed. A side surface of cell unit CU2 facing the second direction is exposed. Conductive line L2($i$) serves as, a bit line (or a word line).

Figure 29:
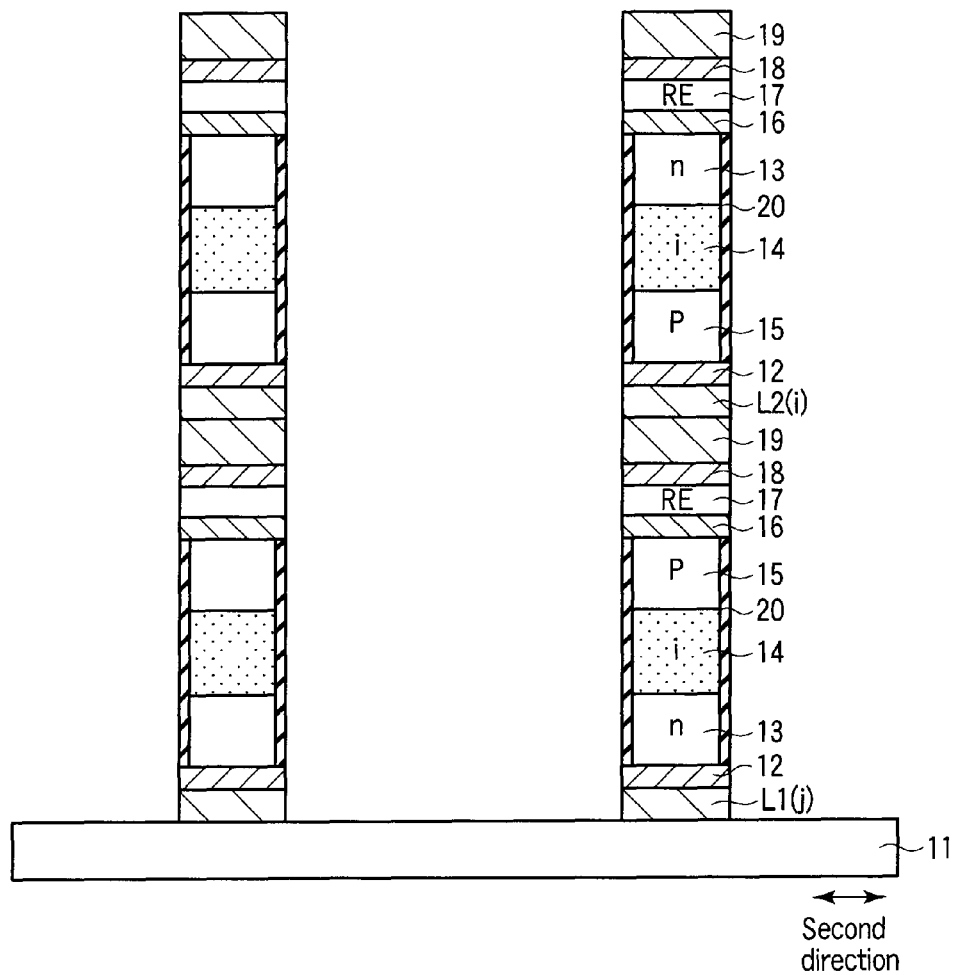

For example, when a thermal oxidation process is performed under the condition in which a water vapor partial ($H_2O$=oxidizing species) pressure in a hydrogen ($H_2$) gas is 3 to 15%, i.e., when selective oxidation is performed, as illustrated in FIG. 29, the silicon oxide film 20 is formed on the side surfaces of the silicon diodes in cell units CU1 and CU2, i.e., only the side surfaces of the p-type semiconductor layer 15, the intrinsic semiconductor layer 14, and the n-type semiconductor layer 13. At this time, the film thickness of the silicon oxide film 20 is 10 nm or less.

In this manner, since the silicon oxide film 20 is formed on only the side surface of the diode by the selective oxidation, in case the diode and the variable resistance film or the phase-change film 17 are cut along planes parallel to the first direction and the second direction, a sectional area of the diode is smaller than a sectional area of the variable resistance film or the phase-change film 17.

Furthermore, since the selective oxidation is used to form the silicon oxide film 20, bird's beaks, as illustrated in FIGS. 15 and 16, may be formed on a contact surface between the silicon oxide film 20 and the electrode layer 12 and a contact surface between the silicon oxide film 20 and the electrode layer 16.

On the structure illustrated in FIG. 29, i.e., on the mask material 19 and the semiconductor substrate 11, the silicon nitride film 21 is formed by, for example, CVD. At this time, a film thickness of the silicon nitride film 21 is 10 nm or less.

Figure 30:
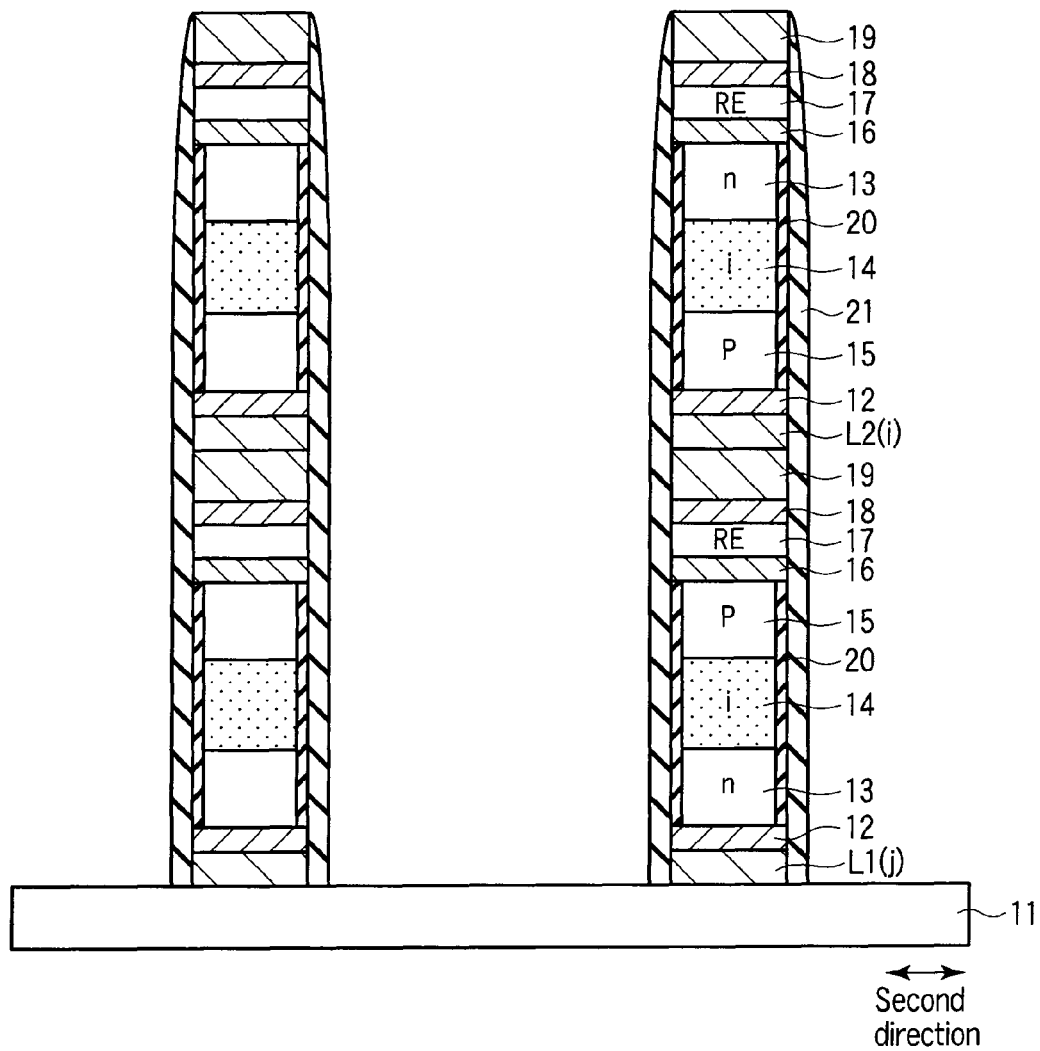

Subsequently, the silicon nitride film 21 is etched by anisotropic etching (for example, RIE), and, as illustrated in FIG. 30, the silicon nitride film 21 is left on the side surfaces of the mask material 19, the electrode layer 18, and the variable resistance film or the phase-change film 17, the side surface of the electrode layer 16, the upper surface of the silicon oxide film 20 on the side surface of the diode, and the side surfaces of conductive lines L1($j$) and L2($j$) in cell units CU1 and CU2. More specifically, the silicon nitride film 21 is formed on the side surfaces of the variable resistance films or the phase-change films 17 in cell units CU1 and CU2, and the silicon nitride film 21 is formed on the silicon oxide film 20 to cover the silicon oxide film 20 on the side surface of the diode.

As illustrated in FIG. 31, insulating interlayers, for example, the coating oxide films 22 are formed on the side surfaces of cell units CU1 and CU2 in the second direction by means of, for example, spin coating. More specifically, the coating oxide film 22 is formed on the silicon nitride film 21. In other words, the coating oxide film 22 is buried in an area between the structures illustrated in FIG. 30. The coating oxide film 22 is a silicon oxide film formed by coating, and consists of, for example, polysilazane or the like.

Furthermore, an upper surface of the coating oxide film 22 is planarized by, for example, CMP, so that the upper surface of the coating oxide film 22 and an upper surface of the mask material 19 are located at almost the same position in the third direction.

With the above steps, cell unit CU1 according to the embodiment is manufactured. Furthermore, the steps described above are repeated to make it possible to manufacture a three-dimensional cross-point memory cell array.

When the cell unit is formed by the manufacturing method described above, double-sidewall films each consisting of a silicon oxide film and a silicon nitride film can be formed on only the side surfaces of the diodes, i.e., the side surfaces of the p-type semiconductor layer 15, the intrinsic semiconductor layer 14, and the n-type semiconductor layer 13. Furthermore, a silicon nitride film can be formed on the side surface of the variable resistance film or the phase-change film serving as a memory element.

In the manufacturing steps described above, an example in which the mask material 19 is left is described. The mask material 19 may be removed after the etching step.

The n-type semiconductor layer 13, the intrinsic semiconductor layer 14, and the p-type semiconductor layer 15 may be formed as amorphous epitaxial layers by epitaxial growth. When the layers are formed by the epitaxial growth, a method of forming openings in conductive line L1($j$), the electrode layer 12 to expose the silicon substrate. Then epitaxially grow the semiconductor layers using the silicon substrate as a crystal seed.

When the n-type semiconductor layer 13, the intrinsic semiconductor layer 14, and the p-type semiconductor layer 15 which configure a diode are formed by epitaxial growth, the rectification characteristic of the diode is preferable more than that obtained when a diode is formed by means of CVD or the like. Furthermore, the silicon oxide film 20 formed on the side surface of the diode can be advantageously easily formed.

[2-8] Materials

Materials used in a cell unit will be described below.

Materials of a p-type semiconductor layer, an intrinsic semiconductor layer, and an n-type semiconductor layer which configures a p-i-n diode are selected from a group consisting of Si, SiGe, Sic, Ge, C, GaAs, an oxide semiconductor, a nitride semiconductor, a carbide semiconductor, and a sulfide semiconductor.

The p-type semiconductor layer (anode layer) is preferably one of p-type Si, $TiO_2$, $ZrO_2$, $InZnO_x$, ITO, $SnO_2$ containing Sb, ZnO containing Al, $AgSbO_3$, $InGaZnO_4$, and $ZnO.SnO_2$.

The n-type semiconductor layer (cathode layer) is preferably one of n-type Si, $NiO_x$, ZnO, $Rh_2O_3$, ZnO containing N, and $La_2CuO_4$.

Crystal states of the p-type semiconductor layer, the intrinsic semiconductor layer, and the n-type semiconductor layer may be one of an amorphous state, a monocrystalline state, and a polycrystalline state.

A conductive line functioning as a word line/bit line consists of W, WSi, NiSi, CoSi, or the like.

The electrode layer consists of Pt, Au, Ag, TiAlN, SrRuO, Ru, RuN, Ir, Co, Ti, TiN, TaN, LaNiO, Al, PtIrOx, PtRhOx, Rh, TaAlN, or the like. The electrode layer may also has a function of a barrier metal layer or an adhesive layer.

The memory element consists of, for example, a binary or ternary metal oxide.

[3] CONCLUSION

According to the embodiment of the present invention, an impurity such as fluorine or hydrogen is suppressed from being diffused in a variable resistance film or a phase-change film serving as a memory element while suppressing an increase in reverse current of a diode used as a rectifier element. In this manner, a semiconductor memory device which can maximally exert the capability of a cell unit can be provided.

The embodiment includes inventions on various stages. The inventions on the various stages can also be extracted by arbitrary combinations of a plurality of constituent elements disclosed in the embodiment.

In this case, the rectifier element is satisfied merely to have a semiconductor layer as at least a part. The rectifier element may be not only a PIN diode but also, for example, an MIS diode (diode having an insulating layer formed between a metal layer and a semiconductor layer), an MIM structure (diode having a structure obtained by sandwiching a semiconductor layer between metal layers), or an SIS structure (diode having a structure obtained by sandwiching an insulating film between semiconductor layers).

The rectifier element may have a bipolar transistor structure which has a semiconductor layer as at least a part and in which two semiconductor layers of the same conductivity type sandwich a semiconductor layer of a conductivity type different from that of the two semiconductor layers. The rectifier element may be a semiconductor-metal-insulator-semiconductor (SMIS) diode which has a semiconductor layer as at least a part and has a four-layer or a thyristor structure in which semiconductor layers of different conductivity types are alternately stacked.

Additional advantages and modifications will readily occur to those skilled in the art. Therefore, the invention in its broader aspects is not limited to the specific details and representative embodiments shown and described herein. Accordingly, various modifications may be made without departing form the spirit or scope of the general inventive concept as defined by the appended claims and their equivalents.

What is claimed is:

1. A semiconductor memory device comprising:
a first conductive line extending in a first direction;
a second conductive line extending in a second direction crossing the first direction;
a cell unit including a phase-change film and a rectifier element connected in series with each other between the first conductive line and the second conductive line;
a silicon nitride film formed on a side surface of the phase-change film;
a double-sidewall film including a silicon oxide film and the silicon nitride film formed on a side surface of the rectifier element; and
a coating oxide film formed between the cell units to isolate the cell units from each other.

2. The semiconductor memory device according to claim 1, wherein when the rectifier element and the phase-change film are cut along planes parallel to the first direction and the second direction, a sectional area of the rectifier element is smaller than a sectional area of the phase-change film.

3. The semiconductor memory device according to claim 1, wherein
the silicon oxide film is in contact with the side surface of the rectifier element, and the silicon nitride film is in contact with the side surface of the phase-change film and covers the silicon oxide film on the side surface of the rectifier element.

4. The semiconductor memory device according to claim 1, wherein the rectifier element includes an amorphous epitaxial layer.

5. The semiconductor memory device according to claim 1, further comprising:
a first electrode layer formed between the first conductor line and the rectifier element; and
a second electrode layer formed between the rectifier element and the phase-change film.

6. The semiconductor memory device according to claim 5, wherein the silicon oxide film has bird's beaks on a contact surface to the first electrode layer and a contact surface to the second electrode layer.

7. The semiconductor memory device according to claim 1, further comprising:
a control circuit connected to the first conductive line and the second conductive line,
wherein the control circuit, without changing the polarity of a voltage applied to the phase-change film, controls a magnitude and an application time of the voltage to reversibly change the resistance of the phase-change film between at least a first value and a second value.

8. The semiconductor memory device according to claim 7, wherein the control circuit comprises a first control circuit connected to the first conductive line and a second control circuit connected to the second conductive line.

9. The semiconductor memory device according to claim 1, wherein the rectifier element includes a p-i-n diode configured by a p-type semiconductor layer, an n-type semiconductor layer, and an intrinsic semiconductor layer arranged between the p-type semiconductor layer and the n-type semiconductor layer.

10. The semiconductor memory device according to claim 1, wherein the silicon oxide film expands to outside of a side surface of the rectifier element.

* * * * *